US009343706B2

(12) United States Patent
Ito et al.

(10) Patent No.: US 9,343,706 B2
(45) Date of Patent: May 17, 2016

(54) SEALING STRUCTURE, DEVICE, AND METHOD FOR MANUFACTURING DEVICE

(71) Applicant: SEMICONDUCTOR ENERGY LABORATORY CO., LTD., Atsugi-shi, Kanagawa-ken (JP)

(72) Inventors: Minato Ito, Tokyo (JP); Kohei Yokoyama, Kanagawa (JP); Yusuke Nishido, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 83 days.

(21) Appl. No.: 13/999,502

(22) Filed: Mar. 5, 2014

(65) Prior Publication Data

US 2014/0252386 A1    Sep. 11, 2014

(30) Foreign Application Priority Data

Mar. 7, 2013    (JP) ................................. 2013-045722

(51) Int. Cl.
| | |
|---|---|
| *H01L 33/00* | (2010.01) |
| *H01L 51/52* | (2006.01) |
| *H01L 27/32* | (2006.01) |

(52) U.S. Cl.
CPC ............ *H01L 51/529* (2013.01); *H01L 51/524* (2013.01); *H01L 27/322* (2013.01); *H01L 27/3276* (2013.01); *H01L 51/5246* (2013.01); *H01L 2924/0002* (2013.01)

(58) Field of Classification Search
CPC . H01L 51/5012; H01L 51/524; H01L 51/525; H01L 51/529; H01L 51/5246
USPC ............. 438/25, 26; 257/40, 79, 98, 667, 680
See application file for complete search history.

(56) References Cited

U.S. PATENT DOCUMENTS

| | | | |
|---|---|---|---|
| 7,345,419 B2 | 3/2008 | Gotoh et al. | |
| 7,701,136 B2 | 4/2010 | Kwak | |
| 7,871,949 B2 | 1/2011 | Lee et al. | |
| 7,944,143 B2 | 5/2011 | Choi et al. | |
| 8,545,281 B2 | 10/2013 | Shimomura et al. | |
| 8,546,281 B2 | 10/2013 | Lee et al. | |
| 8,623,469 B2 | 1/2014 | Shimomura et al. | |
| 2002/0125484 A1* | 9/2002 | Silvernail et al. ................ 257/79 |
| 2003/0066311 A1* | 4/2003 | Li et al. ............................. 65/43 |
| 2004/0207314 A1 | 10/2004 | Aitken et al. | |
| 2010/0227524 A1* | 9/2010 | Jung et al. ........................ 445/25 |
| 2011/0158273 A1* | 6/2011 | Okayama et al. .......... 372/43.01 |
| 2012/0285200 A1 | 11/2012 | Tanaka | |
| 2012/0313128 A1 | 12/2012 | Yokoyama et al. | |
| 2012/0318023 A1 | 12/2012 | Shimomura | |
| 2012/0319092 A1 | 12/2012 | Shimomura | |
| 2013/0048967 A1 | 2/2013 | Nishido et al. | |
| 2013/0049062 A1 | 2/2013 | Hatano et al. | |

(Continued)

*Primary Examiner* — Brook Kebede
(74) *Attorney, Agent, or Firm* — Nixon Peabody LLP; Jeffrey L. Costellia

(57) ABSTRACT

Provided is a device in which heat conduction from a sealant to a functional element is suppressed and whose bezel is slim. The sealing structure includes a first substrate, a second substrate whose surface over which a sealed component is provided faces the first substrate, and a frame-like sealant which seals a space between the first substrate and the second substrate with the first substrate and the second substrate. The second substrate includes a groove portion between the sealant and the sealed component. The groove portion is in a vacuum or includes a substance whose heat conductivity is lower than that of the second substrate.

22 Claims, 17 Drawing Sheets

(56) References Cited

U.S. PATENT DOCUMENTS

| | | |
|---|---|---|
| 2013/0095582 A1 | 4/2013 | Miyairi et al. |
| 2013/0119358 A1* | 5/2013 | Sasaki et al. .................... 257/40 |
| 2013/0134396 A1 | 5/2013 | Shimomura et al. |
| 2013/0134397 A1 | 5/2013 | Yamazaki et al. |
| 2013/0134398 A1 | 5/2013 | Yamazaki et al. |
| 2013/0134570 A1 | 5/2013 | Nishido |
| 2013/0137200 A1 | 5/2013 | Shimomura |
| 2013/0300284 A1 | 11/2013 | Nishido |
| 2014/0027743 A1 | 1/2014 | Nishido |
| 2014/0116614 A1 | 5/2014 | Fukai et al. |
| 2014/0125935 A1 | 5/2014 | Nakamura et al. |
| 2014/0216645 A1 | 8/2014 | Nakamura |

\* cited by examiner

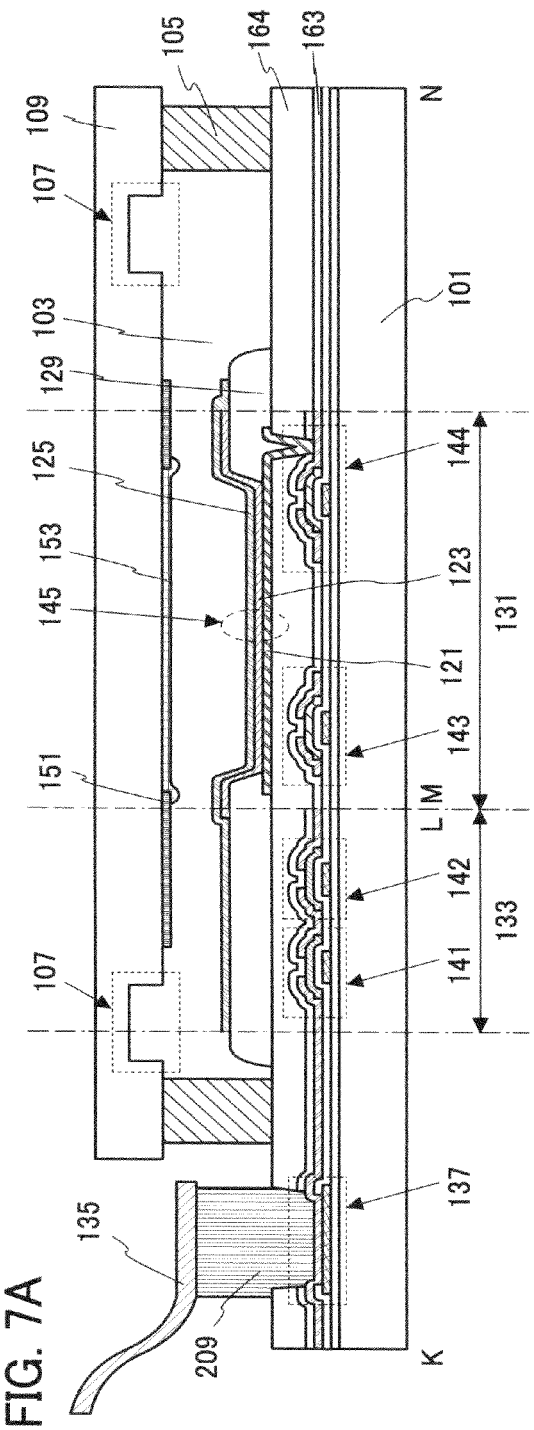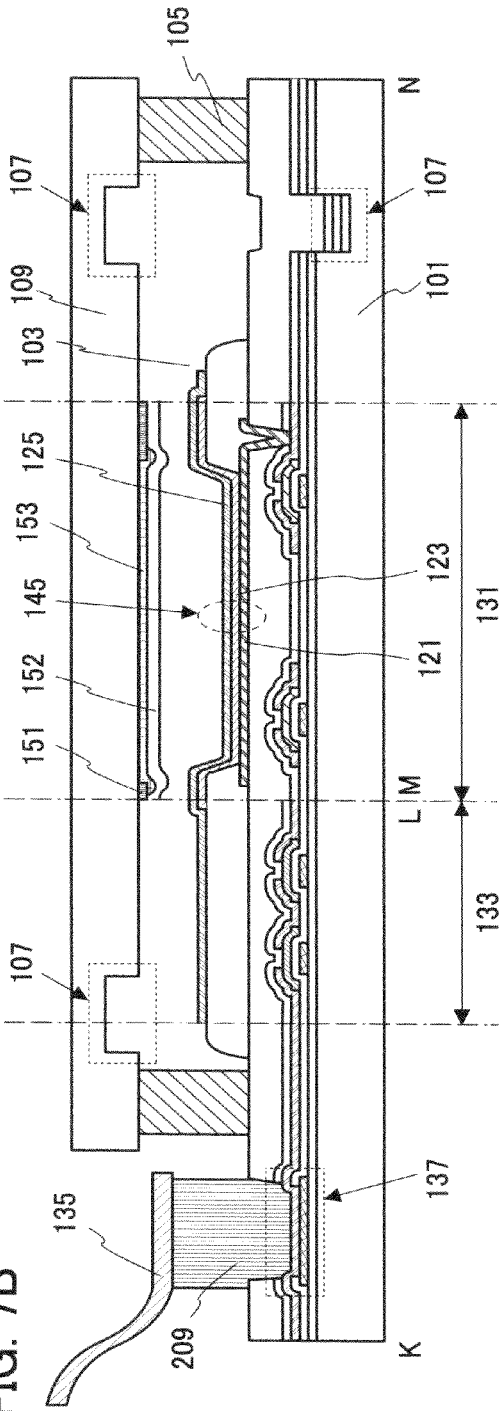

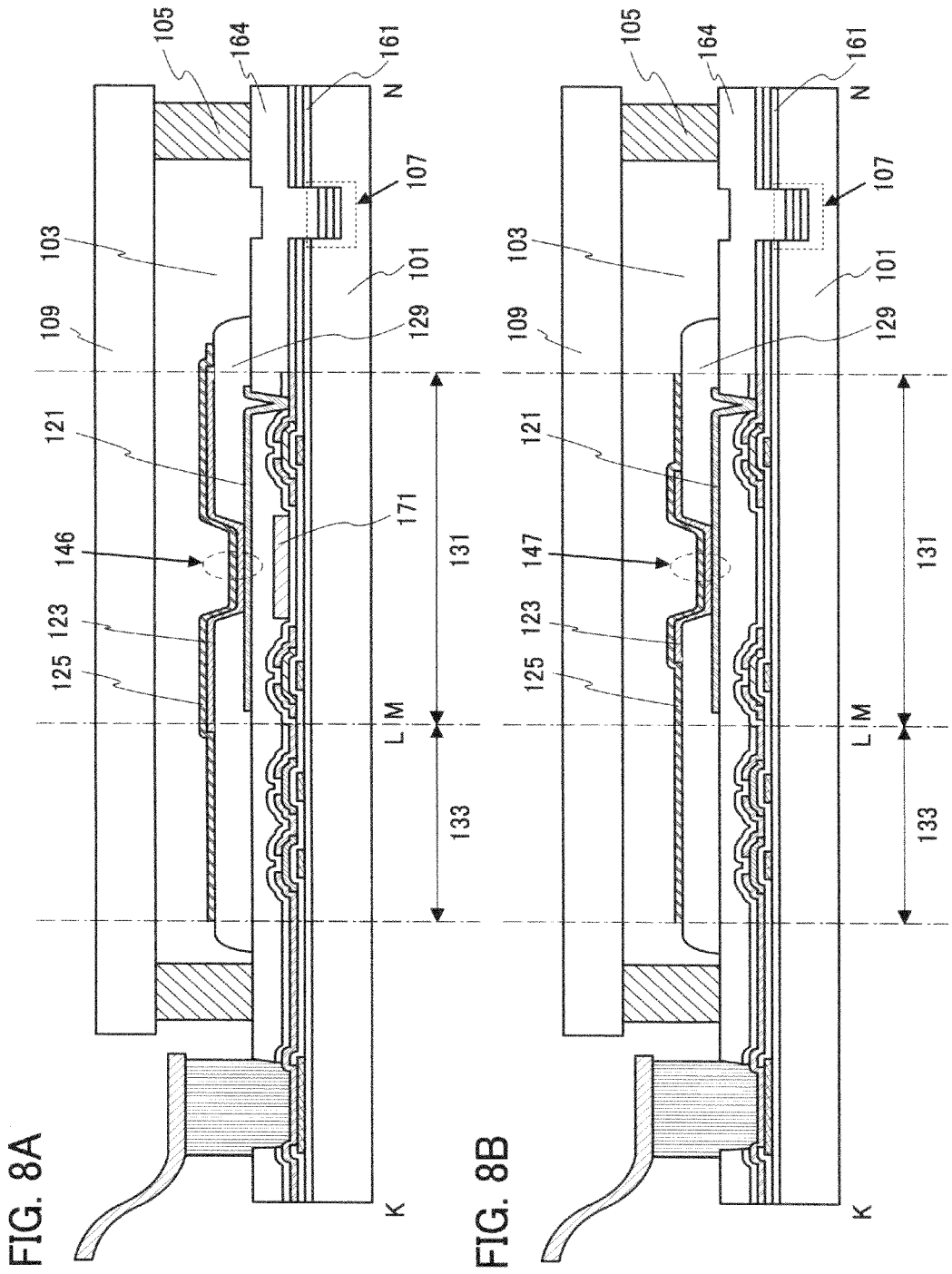

SEALING STRUCTURE, DEVICE, AND METHOD FOR MANUFACTURING DEVICE

BACKGROUND OF THE INVENTION

1. Field of the Invention

One embodiment of the present invention relates to a sealing structure in which a pair of substrates are bonded with the use of glass and a method for manufacturing the sealing structure. Another embodiment of the present invention relates to a device including a functional element with low heat resistance and a method for manufacturing the device. Another embodiment of the present invention relates to a semiconductor device, a light-emitting device, and a display device, or a method for manufacturing these devices. For example, one embodiment of the present invention relates to a light-emitting device using an organic electroluminescence (hereinafter also referred to as EL) phenomenon, and a method for manufacturing the light-emitting device.

2. Description of the Related Art

In recent years, development of light-emitting devices and display devices has been actively promoted, and improvements in reliability and yield, a reduction in device size, a reduction in area except a light-emitting region (display region) (so-called a slim border), and the like have been demanded.

Thus, a sealing structure that allows a device to have a slim bezel, that is, the area for a sealed component (a light-emitting element or the like in the case of a light-emitting device) to be large has been demanded.

In particular, in a sealed component, an element whose properties such as reliability rapidly deteriorates by exposure to the air containing moisture or oxygen, such as a light-emitting element using organic EL phenomenon (also referred to as an organic EL element), is preferably provided inside a sealing structure with high hermeticity.

For example, a technique for forming a sealing structure having high hermeticity in which a pair of substrates is bonded to each other with a glass frit has been known.

For example, a glass package sealed by attaching a first glass plate to a second glass plate with a glass frit, which can be applied to seal an organic EL element, is disclosed in Patent Document 1.

REFERENCE

Patent Document

[Patent Document 1] United States Published Patent Application No. 2004-0207314

SUMMARY OF THE INVENTION

One of the methods for melting a glass frit in order to bond a pair of substrates is laser light irradiation to the glass frit.

When the glass frit is heated and melted by laser light irradiation, heat is conducted from the heated glass frit toward the substrate even if the irradiation time is extremely short. Then, the heat is conducted from the glass frit to a sealed component, such as an element provided over the substrate, through the substrate.

The temperature needed for melting the glass frit (e.g., 450° C. or higher) is higher than the upper temperature limit of a sealed component provided over the substrate in some cases. For example, heat resistance of organic EL elements, organic films, or the like is insufficient in many cases, and color filters might be damaged even at approximately 200° C.

In view of the above, an object of one embodiment of the present invention is to provide a sealing structure that suppresses heat conduction from a sealant to a sealed component. Another object of one embodiment of the present invention is to provide a sealing structure that suppresses heat conduction from a sealant to a sealed component and allows a device to have a slim bezel. Another object of one embodiment of the present invention is to provide a device in which heat conduction from a sealant to an element with low heat resistant is suppressed. Another object of one embodiment of the present invention is to provide a device in which heat conduction from a sealant to an element with low heat resistant is suppressed and whose bezel is slim. Another object of one embodiment of the present invention is to provide a highly reliable electronic device or a highly reliable lighting device whose bezel is slim.

Another object of one embodiment of the present invention is to provide a novel sealing structure or a novel device. Another object of one embodiment of the present invention is to provide a highly reliable sealing structure or a highly reliable device. One object of one embodiment of the present invention is to provide a sealing structure that allows a device to have a slim bezel or to provide a device whose bezel is slim.

Another object of one embodiment of the present invention is to suppress heat damage to a sealed component or a functional element while a sealing structure or a device is manufactured.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention has been made focusing on a heat conduction path from a sealant to a sealed component. In the sealing structure of one embodiment of the present invention, a substrate has a groove portion between the sealant and the sealed component. By providing the groove portion, heat conduction from the sealant to the sealed component through the substrate can be suppressed even when the sealant is heated locally. Therefore, the sealing structure of one embodiment of the present invention is preferably used when a component with low heat resistance is sealed.

By application of one embodiment of the present invention, heat is not easily conducted from the sealant to the sealed component without increasing the distance between the sealant and the sealed component, and heat damage to the sealed component is thus suppressed. Thus, a surface area of a region where the sealed component can be formed in the substrate can be increased (the bezel of the device can be reduced).

One embodiment of the present invention is a sealing structure including a first substrate, a second substrate whose surface over which a sealed component is provided faces the first substrate, and a frame-like sealant which seals a space between the first substrate and the second substrate with the first substrate and the second substrate. The second substrate includes a groove portion between the sealant and the sealed component. The groove portion is in a vacuum or includes a substance with heat conductivity lower than heat conductivity of the second substrate.

Another embodiment of the present invention is a device including a first substrate and a second substrate whose first surfaces face each other, a first functional element over the first surface of the first substrate, and a frame-like sealant which seals the first functional element with the first substrate and the second substrate. The first substrate includes a first groove portion between the first functional element and the sealant. The first groove portion is in a vacuum or includes a substance with heat conductivity lower than heat conductivity of the first substrate.

Another embodiment of the present invention is a device including a first substrate and a second substrate whose first surfaces face each other, a first functional element over the first surface of the first substrate, a second functional element over the first surface of the second substrate, and a frame-like sealant which seals the first functional element with the first substrate and the second substrate. The first substrate includes a first groove portion between the first functional element and the sealant. The first groove portion is in a vacuum or includes a substance with heat conductivity lower than heat conductivity of the first substrate. The second substrate includes a second groove portion between the second functional element and the sealant. The second groove portion is in a vacuum or includes a substance with heat conductivity lower than heat conductivity that of the second substrate.

In the above structures, the substance with low heat conductivity is preferably an inert gas.

In the above structures, a part of the groove portion may be filled with the sealant.

In the above structures, the sealing structure preferably includes an adhesive layer fixing the first substrate and the second substrate on an inner side or an outer side of the sealant. In the above structures, a frame-like resin layer which seals a space between the first substrate and the second substrate with the first substrate and the second substrate is further included. The frame-like resin layer may be surrounded by the sealant or may surround the sealant.

Another embodiment of the present invention is a method for manufacturing a device including the steps of: a first step for forming a groove portion in a first substrate, and a functional element and a sealant which are separated so that the groove portion is sandwiched therebetween; and a second step for facing the first substrate and the second substrate with the functional element and the sealant provided therebetween, heating locally the sealant so that a temperature of the sealant is higher than a temperature of the functional element, and sealing the functional element with the sealant, the first substrate, and the second substrate.

Another embodiment of the present invention is a method for manufacturing a device including the steps of: a first step for forming a groove portion in a first substrate and a functional element over the first substrate, and forming a sealant over a second substrate; and a second step for facing the first substrate and the second substrate with the functional element and the sealant provided therebetween, heating locally the sealant so that a temperature of the sealant is higher than a temperature of the functional element, and sealing the functional element separated from the sealant with the groove portion with the sealant, the first substrate, and the second substrate.

It is preferable that in the first step, a frit paste containing a glass frit and a binder be placed and heated to form a glass layer as the sealant. Further, in the first step, light irradiation is preferably performed to locally heat the frit paste.

In the second step, light irradiation is preferably performed to locally heat the sealant.

Note that in this specification, the light-emitting device or the display device includes not only a panel in which a light-emitting element or a display element is sealed, but also the following modules in its category: a module to which a connector such as an anisotropic conductive film or a Tape Carrier Package (TCP) is attached; a module having a TCP at the tip of which a printed wiring board is provided; and a module in which an integrated circuit (IC) is directly mounted on a display element by a Chip On Glass (COG) method.

According to one embodiment of the present invention, a sealing structure in which heat conduction from a sealant to a sealed component is suppressed can be provided. According to one embodiment of the present invention, a sealing structure in which heat conduction from a sealant to a sealed component is suppressed and whose border can be slim can be provided. According to one embodiment of the present invention, a device in which heat conduction from a sealant to a functional element is suppressed can be provided. According to one embodiment of the present invention, a device in which heat conduction from a sealant to a functional element is suppressed and whose border is slim can be provided. According to one embodiment of the present invention, a highly reliable electronic device or a highly reliable lighting device whose border is slim can be provided.

BRIEF DESCRIPTION OF THE DRAWINGS

FIGS. 7A and 7B each illustrate an example of a light-emitting device.
FIGS. 8A and 8B each illustrate an example of a light-emitting device.

DETAILED DESCRIPTION OF THE INVENTION

Figure 1A:
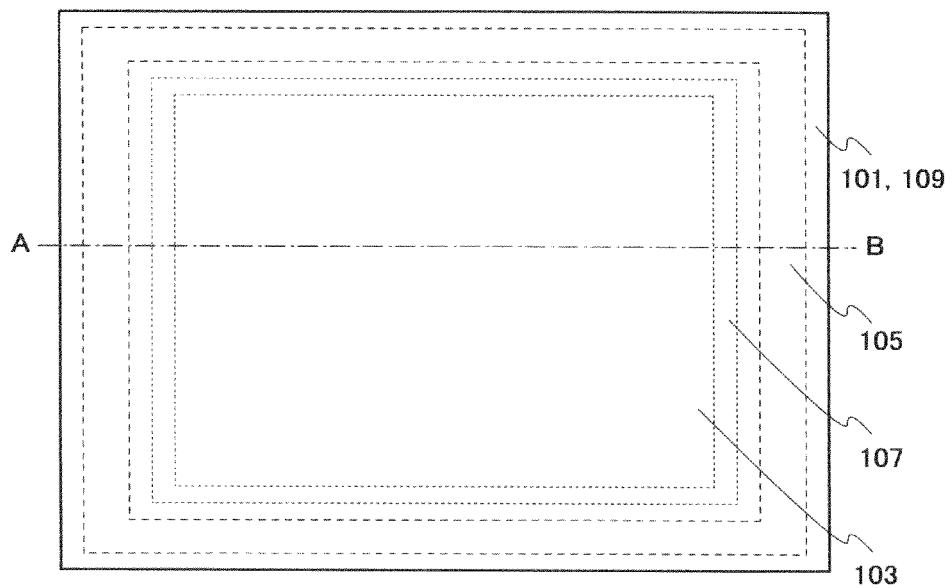
FIGS. 1A to 1D illustrate examples of a sealing structure.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, a sealing structure of one embodiment of the present invention is described using FIGS. 1A to 1D, FIGS. 2A and 2B, FIGS. 3A to 3E, and FIGS. 4A to 4G.

<Structure of Sealing Structure>

Figure 1B:
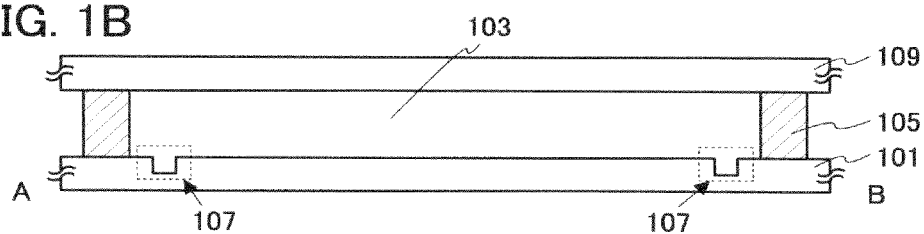
Figure 1C:
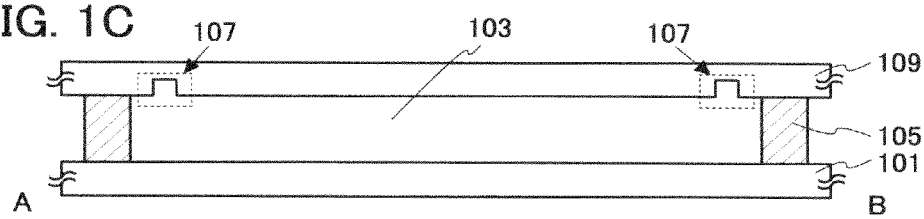
Figure 1D:
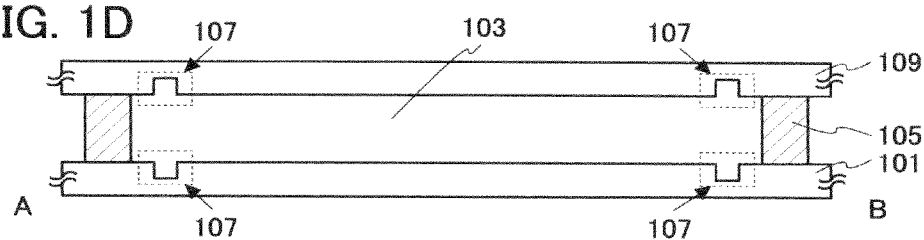

FIG. 1A is a plan view of the sealing structure of one embodiment of the present invention. FIGS. 1B to 1D are three kinds of examples of cross-sectional views taken along dashed-dotted line A-B in FIG. 1A.

As illustrated in FIGS. 1A to 1D, the sealing structure of one embodiment of the present invention includes a substrate 101 and a substrate 109 the first surfaces of which face each other; a frame-like sealant 105 which seals a space 103 with the substrate 101 and the substrate 109; and a groove portion 107 (also referred to as a depressed portion) provided in at least one of the first surface of the substrate 101 and the first surface of the substrate 109. The groove portion 107 is surrounded by the sealant 105.

The space 103 is in a vacuum or filled with a material having lower heat conductivity than the substrates 101 and 109. Thus, heat is not easily conducted from the sealant 105 to the sealed component through the space 103. In description below, heat is conducted from the sealant 105 to the sealed component through the substrates 101 or 109 (i.e., heat conduction from the sealant 105 to the sealed component through the space 103 is not considered). Note that in one embodiment of the present invention, the groove portion 107 in the substrate is also in a vacuum as the space 103 or filled with the material similar to that of the space 103.

FIG. 1B is an example in which the groove portion 107 is provided in the first surface of the substrate 101.

Figure 2A:
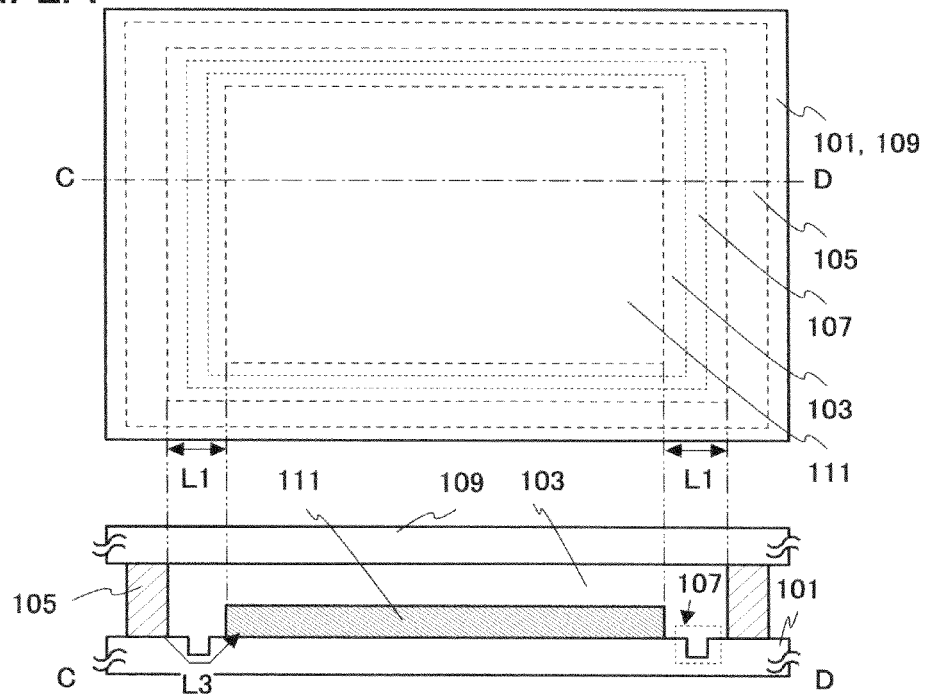
FIGS. 2A and 2B illustrate examples of a sealing structure.
Figure 2B:
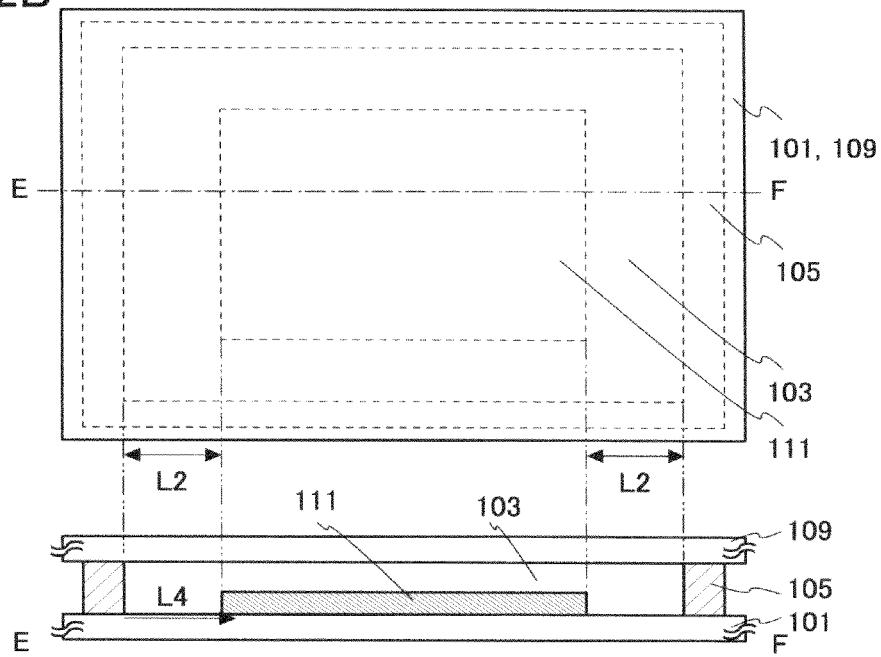

FIG. 2A is a plan view and a cross-sectional view taken along dashed-dotted line C-D in which a sealed component 111 is provided in the sealing structure shown in FIGS. 1A and 1B. FIG. 2B is a plan view and a cross-sectional view taken along dashed-dotted line E-F, illustrating a comparative example in which the sealed component 111 is provided in a sealing structure whose substrates have no groove portion 107.

In the comparative example shown in FIG. 2B, the shortest path L4 through which heat is conducted from the sealant 105 to the sealed component 111 is equivalent to the distance L2 between the sealed component 111 and the sealant 105. Thus, the distance L2 between the sealed component 111 and the sealant 105 needs to be large to suppress heat damage to the sealed component 111. However, such a structure is not preferable because the area of the sealed component 111 with respect to the area of the first surface of the substrate is reduced.

On the other hand, the structure shown in FIG. 2A to which one embodiment of the present invention is applied includes the groove portion 107 in the substrate 101; thus, the shortest path L3 through which heat is conducted from the sealant 105 to the sealed component 111 through the substrate 101 is longer than the distance L1 between the sealed component 111 and the sealant 105.

That is, in the case where the distance between the sealed component 111 and the sealant 105 in FIG. 2A is the same as that in FIG. 2B, heat damage to the sealed component 111 can be suppressed in the structure with the groove portion 107, compared to the structure without the groove portion 107.

Further, in the case where the shortest path L4 in FIG. 2B is equal to the shortest path L3 in FIG. 2A (in this case, heat reaches the sealed component 111 equivalently), the distance L1 between the sealed component 111 and the sealant 105 in the structure including the groove portion 107 is smaller the distance L2 in the structure not including the groove portion 107. By application of one embodiment of the present invention, heat does not easily reach the sealed component 111 from the sealant 105, so that a distance can be reduced between the sealed component 111 and the sealant 105.

Therefore, the structure shown in FIG. 1B can suppress heat conduction to the sealed component provided over the substrate 101 when the sealant 105 is heated locally. Alternatively, a sealing structure that allows the sealed component over the substrate 101 to be less damaged by heat and the distance is reduced between the sealed component and the sealant 105 is obtained.

FIG. 1C is an example in which the groove portion 107 is provided in the first surface of the substrate 109. This structure can suppress heat conduction to the sealed component provided over the substrate 109 when the sealant 105 is heated locally. Alternatively, a sealing structure that allows the sealed component over the substrate 109 to be less damaged by heat and the distance is reduced between the sealed component and the sealant 105 is obtained.

FIG. 1D is an example in which the groove portion 107 is provided in each first surface of the substrates 101 and 109. This structure can suppress heat conduction to the sealed component provided over the substrates 101 and 109 when the sealant 105 is heated locally. Alternatively, a sealing structure that allows the sealed components over the substrates 101 and 109 to be less damaged by heat and the distances are reduced between the sealed components and the sealant 105 is obtained.

FIGS. 3A to 3E are examples showing the shape of the groove portion 107.

Figure 3A:
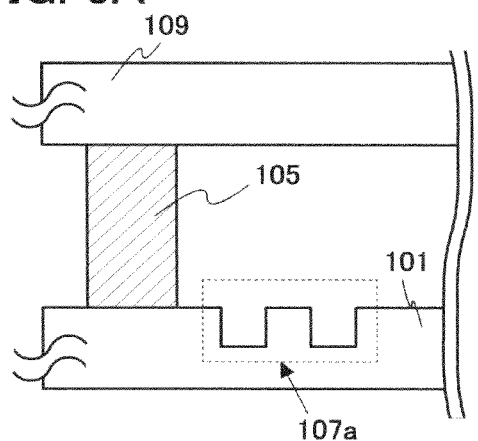
FIGS. 3A to 3E illustrate examples of a sealing structure.

The shape of the groove portion is not limited to the above-described one which is formed of a single groove, and a plurality of grooves can be formed like a groove portion 107a shown in FIG. 3A.

Figure 3D:
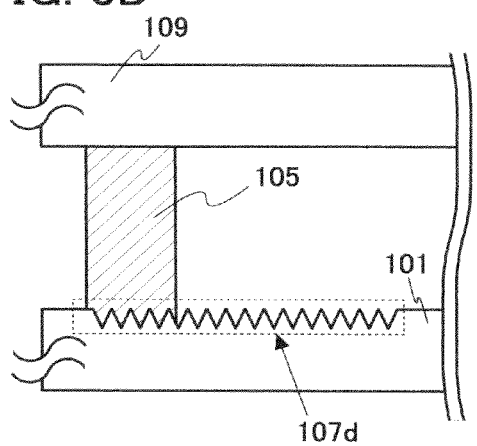
Figure 3B:
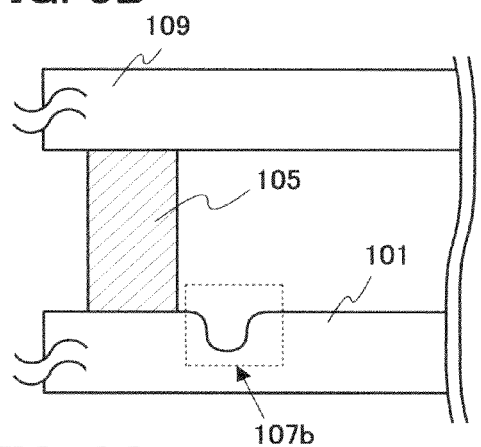

The shape of the bottom and the corner of a groove portion is not limited to the above-described one with sharp corners, and the shape may have a curvature like a groove portion 107b shown in FIG. 3B.

Figure 3E:
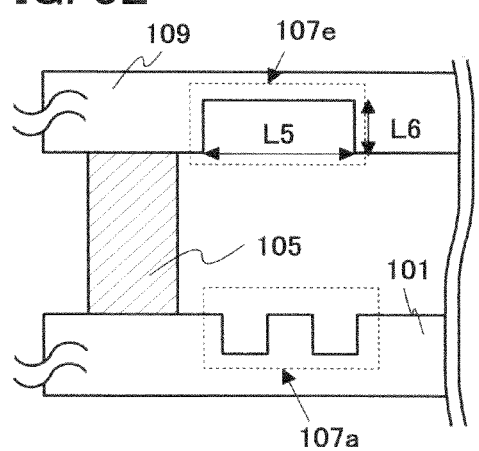
Figure 3C:
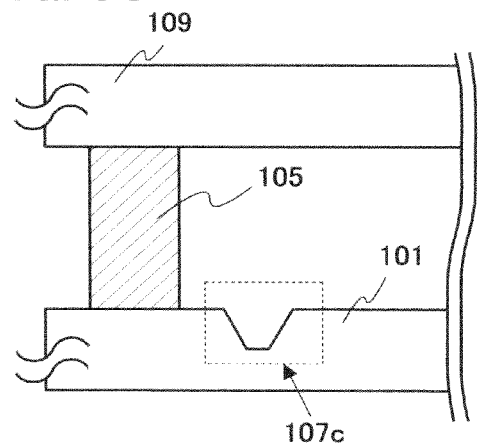

The side surface of a groove portion can be tapered like a groove portion 107c shown in FIG. 3C.

Some of grooves in a groove portion may be filled with the sealant 105 as shown in the groove portion 107d in FIG. 3D. It is preferable that a plurality of grooves provided on the substrate be in contact with the sealant 105, because contact area between the sealant 105 and the substrate is increased and thus the adhesion between the sealant 105 and the substrate can be increased.

One substrate and the other substrate included in a sealing structure may have groove portions with different shapes. FIG. 3E shows an example in which the substrate 101 has the groove portion 107a formed of a plurality of grooves and the substrate 109 has a groove portion 107e (formed of one groove), which is different from the groove portion 107a.

Note that the larger the width L5 of the groove portion is, the larger the shortest path through which heat is conducted from the sealant 105 to the sealed component through the substrate is. However, the larger the width L5 of the groove portion is, the smaller a region where the sealed component is provided is. Thus, the width L5 of the groove portion is, for example, larger than or equal to 10 μm and smaller than or equal to 200 μm, preferably larger than or equal to 20 μm and smaller than or equal to 200 μm. Note that in the case where the width is varied depending on the depth like the groove portion 107c in FIG. 3C, the widest part of the groove portion is the width L5.

The larger the depth L6 of the groove portion is, the larger the shortest path through which heat is conducted from the sealant 105 to the sealed component 111 is. However, when the depth L6 of the groove portion is large, the strength of the substrate may be decreased or time required to form the groove portion may be increased. Thus, the depth L6 of the groove portion is, for example, larger than or equal to 20 μm and smaller than or equal to 200 μm, preferably larger than or equal to 50 μm and smaller than or equal to 200 μm. Note that in the case where the depth in a groove portion formed of the plurality of grooves is fluctuated depending on the grooves, the deepest part of the groove portion is the depth L6.

A groove portion with small width L5 and large depth L6 is particularly preferable. As the width L5 is smaller, the bezel can be slim; as the depth L6 is larger, heat does not easily reach the sealed component 111 from the sealant 105 and heat damage to the sealant 111 is suppressed. For example, a groove portion is formed so that the depth L6 is 1 to 2 times the width L5. Note that if the depth L6 is more than 2 times the width L5, productivity might be decreased.

<Material of Sealing Structure>

Next, a material for the sealing structure of one embodiment of the present invention is described.

For the substrate 101 and the substrate 109, a material is used which has heat resistance high enough to resist the process for manufacturing the sealing structure and the sealed component encapsulated in the sealing structure. Further, the substrates 101 and 109 are not particularly limited in thickness and size as long as they are applicable to a manufacturing apparatus. For example, a substrate using an inorganic material, such as a glass substrate, a ceramic substrate, or a metal substrate; a substrate using a composite material of an organic material and an inorganic material, such as a lamination of a resin substrate and an inorganic material, fiber-reinforced plastics (FRP), or a prepreg, can be used. The substrates 101 and 109 may have flexibility with which the sealed component is not broken. For example, a glass substrate with a small thickness of 50 μm to 500 μm or a metal foil substrate can be used. Note that a material that transmits laser light is used at least one of the substrate 101 and the substrate 109.

As described above, the space 103 is in a vacuum or filled with a material having lower heat conductivity than the substrates 101 and 109. The space 103 is preferably filled with an inert gas such as a rare gas or a nitrogen gas or in a reduced pressure atmosphere.

As the sealant 105, a material having heat fusibility, a heat-sealing material, a heat curable material, or the like can be used. The sealant 105 can be formed using a glass frit or a glass ribbon. The glass frit or the glass ribbon contains at least a glass material.

For example, a functional element with low heat resistance is included as the sealed component 111. As examples of the sealed component 111, a semiconductor element such as a transistor, a light-emitting element, a liquid-crystal element, an element included in a plasma display, and a color filter are given. The category of a light-emitting element includes an element whose luminance is controlled by current or voltage, and specifically includes an inorganic EL element, an organic EL element, and the like. Furthermore, a display medium whose contrast is changed by an electric effect, such as an electronic ink display (electronic paper), can be used. One embodiment of the present invention is particularly preferable in the case where a functional element with low heat resistance, such as an organic EL element and a color filter, is applied as a sealed component. Note that the followings are also embodiments of the present invention: a semiconductor device in which a transistor is included as a sealed component, a light-emitting device in which a light-emitting element is included as a sealed component, a display device in which a display element such as a liquid-crystal element and a light-emitting element is included as a sealed component.

<Methods for Manufacturing Sealing Structure>

An example of a method for manufacturing a sealing structure, which is one embodiment of the present invention, including a sealed component will be described with reference to FIGS. 4A to 4G.

<<1. The Case where a Sealed Component is Provided on Either One of Substrates>>

Figure 4A:
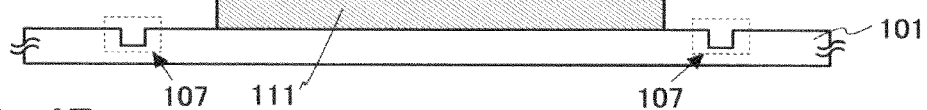
FIGS. 4A to 4G illustrate an example of a method for manufacturing a light-emitting device.

First, the groove portion 107 and the sealed component 111 are formed on the first surface of the substrate 101 (FIG. 4A).

The groove portion 107 can be formed by wet etching, dry etching, laser etching (using a laser beam), sandblasting, photolithography, using an ion beam, an electron beam, dicer, or the like.

Although the formation order of the groove portion 107 and the sealed component 111 is not limited, it is preferable that the groove portion 107 be formed and then the sealed component 111 be formed. Thus, the sealed component 111 can be prevented from being contaminated by dust generated in formation of the groove portion 107, thereby suppressing reduction in reliability of the device. In some cases, a formation method of the groove portion 107 is limited because of the sealed component 111. In view of this, the groove portion 107 is preferably formed prior to the sealed component 111.

Figure 4B:
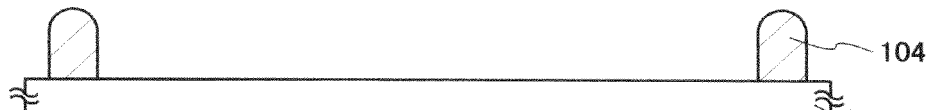

Next, a frit paste 104 is provided on the first surface of the substrate 109 (FIG. 4B). The frit paste 104 is provided by a printing method such as screen printing or gravure printing, a coating method such as a dispensing method or an ink-jet method, or the like. For example, the frit paste 104 having a frame-like shape is formed by screen printing.

When a frit past is applied to a substrate over which a sealed component is provided, a method and conditions for heating the frit paste are limited by the heat resistance of the sealed component in some cases. It is thus preferable that a frit paste be applied to a substrate over which a sealed component is not provided.

The frit paste includes a glass frit (a powdery glass material), an organic solvent, and a binder (e.g., a resin). The frit paste can be formed using a variety of materials and can employ a variety of structures. For example, terpineol, n-butyl carbitol acetate, or the like can be used as the organic solvent and a cellulosic resin such as ethylcellulose can be used as the resin. Further, the frit paste may include a light-absorbing material that absorbs light having a wavelength of laser light.

A glass material used for the glass frit preferably contains one or more compounds selected from, for example, the following groups: magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, and borosilicate glass. The glass frit preferably contains at least one or more kinds of transition metals to absorb infrared light.

After the frit paste 104 is provided, drying treatment may be performed to remove the organic solvent in the frit paste 104. The drying treatment is performed to dry the frit paste 104 at a temperature lower than the upper temperature limit of a material provided over the substrate 109. For example, the drying treatment may be performed at a temperature of 100° C. or higher and 200° C. or lower for 10 minutes or longer and 30 minutes or shorter.

Next, to form a glass layer, the frit paste 104 is heated (i.e., pre-baking is performed) to remove the organic solvent or binder in the frit paste 104. As the pre-baking, the frit paste may be locally heated by laser light irradiation, or the whole substrate on which the frit paste is provided may be heated using a heating furnace, a lamp, a heater, or the like. The heating temperature is preferably close to the glass transition point of the glass frits which are used; for example, 300° C. or higher and 450° C. or lower.

The glass frits contained in the frit paste 104 may be completely melted and firmly attached one another to be one or may be partly welded by the prebaking. In addition, the organic solvent or the binder might fail to be completely removed and remain in the glass layer depending on the conditions for the prebaking.

As the laser light in the pre-baking, for example, laser light with a wavelength in a visible light region, an infrared region, or an ultraviolet region can be used.

Examples of the laser which emits light with a wavelength in the visible light region or the infrared region include a gas laser such as an Ar laser, a Kr laser, or a $CO_2$ laser; and a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser. Note that in the solid-state laser, the fundamental wave or the second harmonic is preferably used. In addition, a semiconductor laser such as GaN, GaAs, GaAlAs, InGaAsP, or the like can be used. The semiconductor laser has an advantage in that oscillation output is stable, a frequency of maintenance is reduced, and operational costs are low.

Examples of the laser which emits light with a wavelength in the ultraviolet region include an excimer laser such as a XeCl laser or a KrF laser; and a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser. Note that in the solid-state laser, the third harmonic or the fourth harmonic is preferably used.

The top surface of the glass layer is preferably flat to increase the adhesion to the counter substrate. Treatment for obtaining uniform thickness and flatness may be performed; for example, a flat plate or the like is pressed against the glass layer; or the top surface of the glass layer is flattened with the use of a spatula. The treatment can be performed before or after the pre-baking.

Figure 4C:
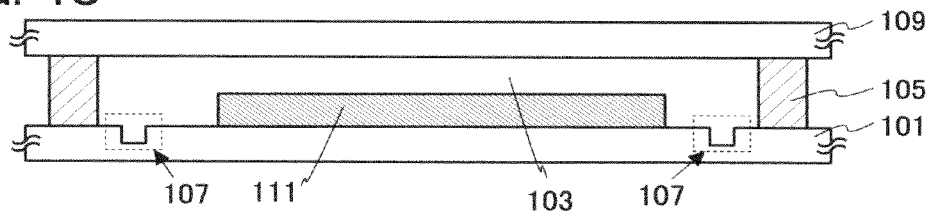
Figure 4D:
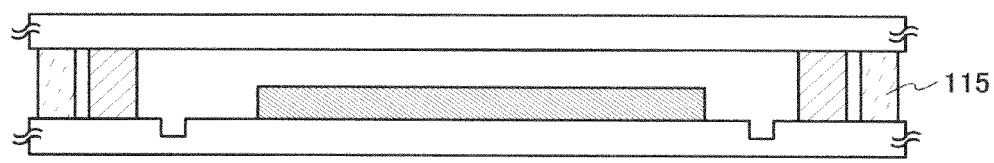
Figure 4E:
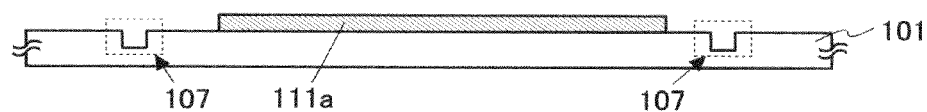

Next, the first surface of the substrate 109 is placed facing the first surface of the substrate 101. Then, the glass layer is locally heated by laser light irradiation to melt the glass frit, so that the sealant 105 is formed. The substrate 101 and the substrate 109 are bonded to each other with the sealant 105 (FIG. 4C).

The laser light irradiation is preferably performed while a region where the glass layer is provided is being scanned with the laser light. The laser light irradiation may be performed on the substrate 101 side or the substrate 109 side. In this embodiment, light with a wavelength which passes through the substrate 109 is emitted because the irradiation with the laser light is performed on the substrate 109 side. For example, light with a wavelength in the visible light region or the infrared region is emitted. Further, with the use of light having high energy which does not transmit the substrate (e.g., wavelength in an ultraviolet region), the glass layer can be directly irradiated with the laser light and heated. As laser emitting the laser light, the above-described laser used in the pre-baking is given, for example.

In the laser light irradiation to heat the glass frit, it is preferable to apply pressure so that the glass layer and the substrate (here, the substrate 101) can be in contact with each other without fail. For example, the pressure may be applied to the glass layer with the substrate 101 and the substrate 109 held with a clamp outside the region irradiated with the laser light, or the pressure may be uniformly applied to one or both of the surfaces of the substrate 101 and the substrate 109.

Further, the space 103 is preferably brought into an inert gas atmosphere or a reduced pressure atmosphere after the laser light irradiation. For example, before the laser light irradiation, a resin such as an ultraviolet curable resin or a thermosetting resin is provided in advance on the outer side or the inner side of the frit paste 104 on the substrate. Then, the substrate 101 and the substrate 109 are temporarily bonded to each other in an inert gas atmosphere or a reduced pressure atmosphere and then irradiated with the laser light in an air atmosphere or an inert gas atmosphere (see a resin layer 115 in FIG. 4D). In the case where the resin has a frame-like shape, the space 103 can be kept in the inert gas atmosphere or the reduce pressure atmosphere, and laser light irradiation can be performed in atmospheric pressure. Thus, the structure of a device can be simplified. Further, because the space 103 is brought into a reduced pressure atmosphere in advance, the glass layer and the substrates can be in contact with each other without fail even without using an apparatus such as a clamp for pressing the two substrates at the time of laser light irradiation.

Note that in manufacturing the sealing structure, an adhesive layer for temporary fixing may be used for alignment of the substrates. In this case, the adhesive layer for temporary fixing is placed the inner side or the outer side of the sealant and a pair of substrates are placed so as to be bonded with the adhesive layer. A resin such as a photocurable resin and a thermosetting resin can be used for the adhesive layer, and the above-described frame-like resin is referred to as one embodiment of the adhesive layer for temporary fixing.

<<2. The Case where a Sealed Component is Provided on Both Substrates>>

Figure 4F:
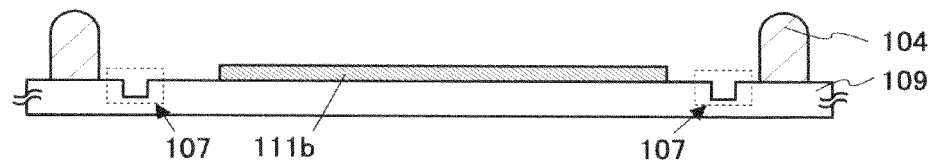

First, the groove portion 107 and a sealed component 111a are formed on the first surface of the substrate 101 (FIG. 4E), and the groove portion 107 and a sealed component 111b are formed on the first surface of the substrate 109 (FIG. 4F).

Next, the frit paste 104 is provided on the first surface of the substrate 101 or 109 (FIG. 4F). Here, the frit paste 104 is provided on the first surface of the substrate 109.

Next, the frit paste 104 is heated (i.e., pre-baking is performed) to remove the organic solvent or binder in the frit paste 104, so that a glass layer is formed.

Because the sealed component 111b is provided on the substrate 109, it is not preferable to heat the whole substrate 109 in the case where the heat resistance of the sealed component 111b is lower than that of the glass transition point of the glass frit. Thus, the frit paste 104 is locally heated by laser light irradiation. Because the first surface of the substrate 109 has a groove in one embodiment of the present invention, heat conduction from the locally heated frit paste 104 to the sealed component can be suppressed.

Figure 4G:
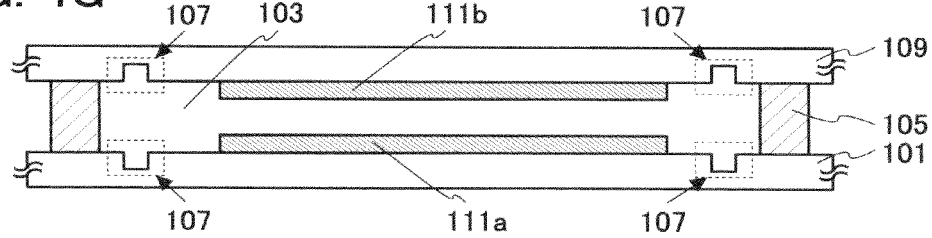

Next, the first surface of the substrate 109 is placed facing the first surface of the substrate 101. Then, the glass layer is locally heated by laser light irradiation to melt the glass frit, so that the sealant 105 is formed. The substrate 101 and the substrate 109 are bonded to each other with the sealant 105 (FIG. 4G).

Through the above, a sealed component of one embodiment of the present invention can be encapsulated in the sealing structure.

Because a sealing structure of one embodiment of the present invention includes a substrate having a groove portion, heat is not easily conducted from a sealant to a sealed component through the substrate. Thus, heat damage to the sealed component can be suppressed and reliability can be improved. Further, heat damage to the sealed component can be suppressed without increasing the distance between the sealed component and the sealant; thus, the bezel can be slim.

This embodiment can be combined with any other embodiment as appropriate.

Embodiment 2

In this embodiment, a light-emitting device and a display device which are one embodiment of the present invention are described with reference to FIGS. 5A to 5C, FIGS. 6A to 6C, FIGS. 7A and 7B, and FIGS. 8A and 8B. In this embodiment, a light-emitting device and a display device which include an organic EL element is described as an example.

Figure 5A:
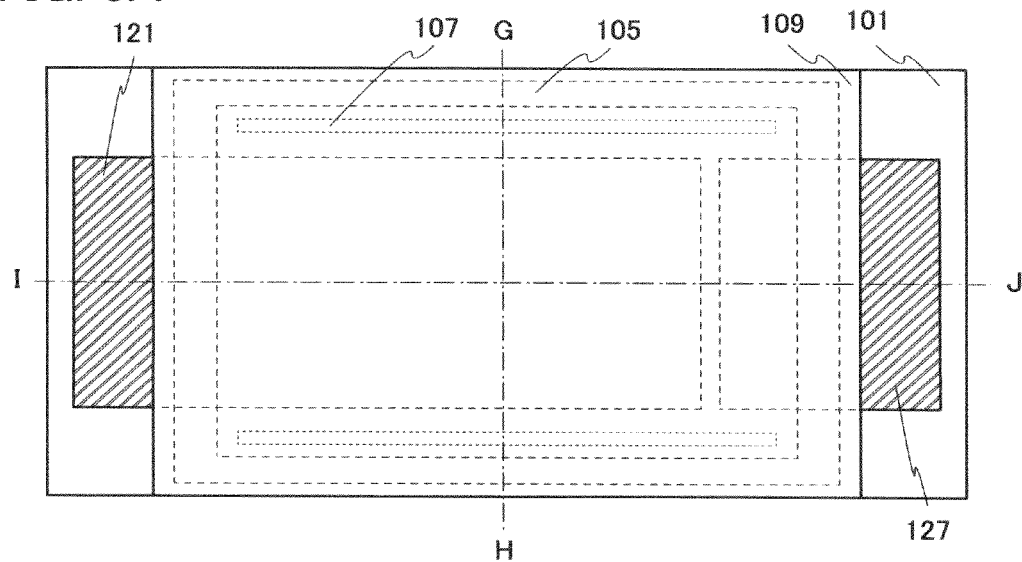
FIGS. 5A to 5C illustrate an example of a light-emitting device.
Figure 5B:
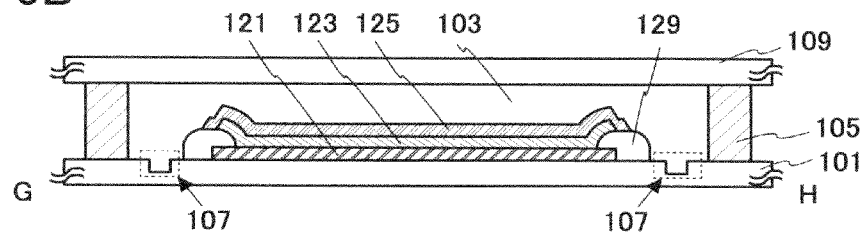
Figure 5C:
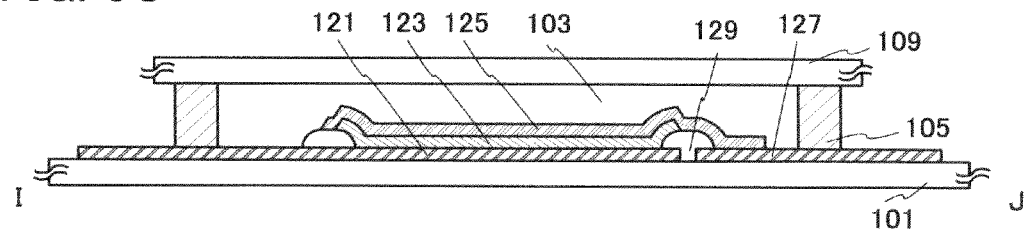

FIG. 5A is a plan view of a light-emitting device of one embodiment of the present invention. FIG. 5B is a cross-sectional view taken along dashed-dotted line G-H in FIG. 5A. FIG. 5C is a cross-sectional view taken along dashed-dotted line I-J in FIG. 5A.

As illustrated in FIGS. 5A to 5C, the light-emitting device of this embodiment of the present invention includes the substrate 101 and the substrate 109 the first surfaces of which face each other; the frame-like sealant 105 which seals the space 103 with the substrate 101 and the substrate 109; and the groove portion 107 and a light-emitting element which are provided in the first surface of the substrate 101. The groove portion 107 is surrounded by the sealant 105.

The light-emitting element includes a first electrode 121 over the substrate 101, an EL layer 123 over the first electrode 121, and a second electrode 125 over the EL layer 123. An edge of the first electrode 121 is covered with a partition wall 129.

The second electrode 125 is electrically connected to a conductive layer 127 over the substrate 101. Parts of the sealant 105 overlap the first electrode 121 and the conductive layer 127. The first electrode 121 and the conductive layer 127 are electrically insulated from each other by the partition wall 129.

The first electrode 121 and the conductive layer 127 extend beyond a region (also referred to as sealed region) sealed by the substrate 101, the substrate 109, and the sealant 105. When the first electrode 121 and the conductive layer 127 overlap the groove portion 107, the first electrode 121 and the conductive layer 127 might be disconnected due to the groove portion 107. It is thus not preferable that layers extending beyond the sealed region, such as the first electrode 121 and the conductive layer 127, be overlap the groove portion 107.

Figure 6A:
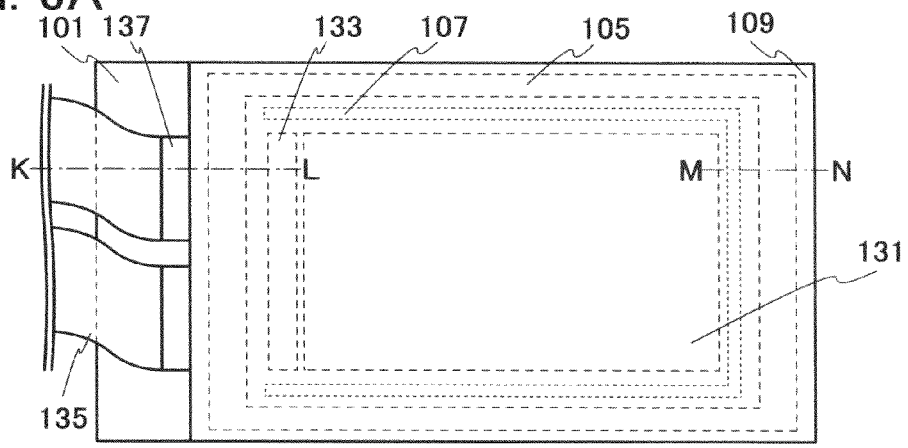
FIGS. 6A to 6C illustrate an example of a light-emitting device.
Figure 6B:
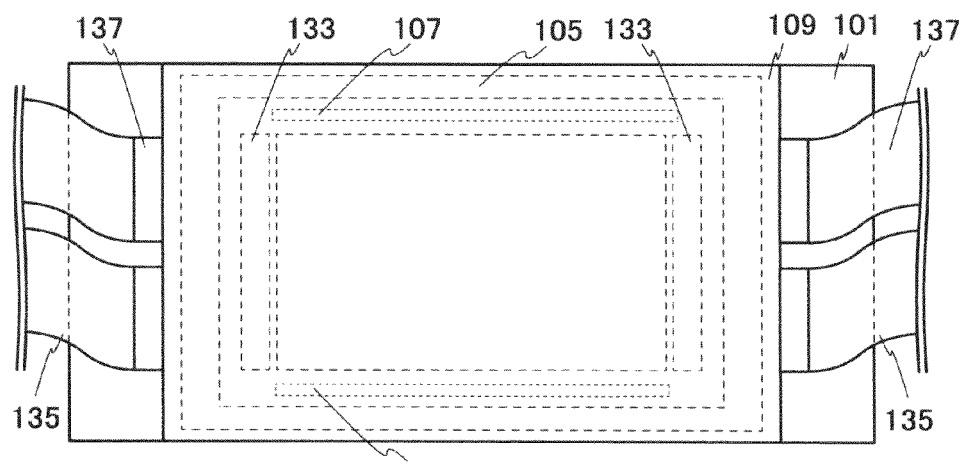
Figure 6C:
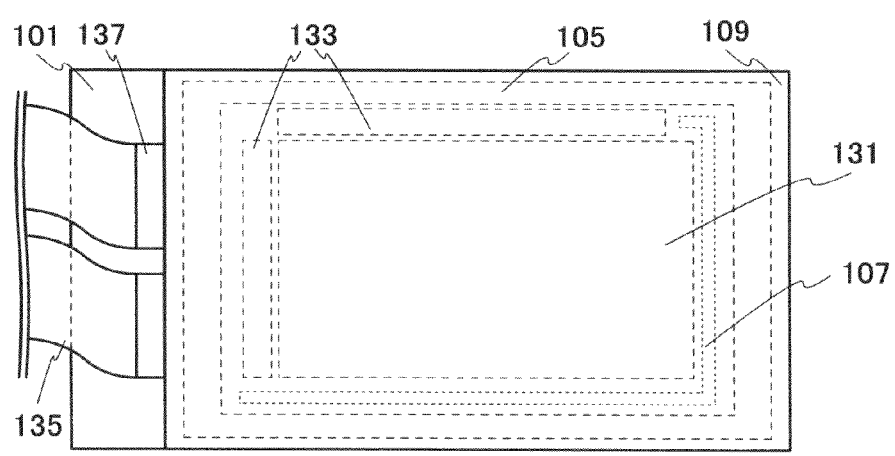

FIGS. 6A to 6C are plan views illustrating a display device of one embodiment of the present invention.

The display devices of one embodiment of the present invention shown in FIGS. 6A to 6C include the substrate 101 and the substrate 109 the first surfaces of which face each other, the frame-like sealant 105, the groove portion 107 provided in at least one of the first surfaces of the substrates 101 and 109, and a terminal portion 137. The groove portion 107 is surrounded by the sealant 105. The sealant 105 seals a pixel portion 131 and a driver circuit portion 133 with the substrate 101 and the substrate 109. A flexible printed circuit (FPC 135) is electrically connected to the terminal portion 137. A variety of signals and potentials are supplied to the pixel portion 131 from the FPC 135 through the terminal portion 137 and the driver circuit portion 133. The display device may further be provided with a protective circuit for protecting the driver circuit.

The display device shown in FIG. 6A includes the driver circuit portion 133, the terminal portion 137, and the FPC 135 one each. The display device in FIG. 6B includes the driver circuit portion 133, the terminal portion 137, and the FPC 135 two each. The display device in FIG. 6C includes two driver circuit portions 133, and the terminal portion 137 and the FPC 135 one each.

The driver circuit portion 133 includes a plurality of transistors. As the driver circuit portion 133, any of a variety of circuits such as a CMOS circuit, a PMOS circuit, or an NMOS circuit can be used. A driver-integrated display device of this embodiment includes the driver circuit portion 133 which is formed over an insulating surface on which the pixel portion 131 is formed. However, the driver circuit may be formed over a surface different from the insulating surface on which the display portion 131 is formed.

In the display devices in FIGS. 6A to 6C, the groove portion 107 is not provided between the driver circuit portion 133 and the sealant 105. Part of a wiring which electrically connects the driver circuit portion 133 and the terminal portion 137 might be disconnected by providing the groove portion 107. The distance between the sealant 105 and the pixel portion 131 is large enough because the driver circuit portion 133 is provided therebetween; thus, heat is not easily conducted from the sealant 105 to the pixel portion 131 without the groove portion 107 between the driver circuit portion 133 and the sealant 105. Thus, the display device of one embodiment of the present invention includes a groove in a region where an element is not provided between the pixel portion 131 and the sealant 105, so that heat damage to an element included in the pixel portion 131 can be suppressed and reliability can be improved.

FIGS. 7A and 7B and FIGS. 8A and 8B are four kinds of cross-sectional views taken along dashed-dotted lines K-L and M-N in FIG. 6A.

The display devices illustrated in FIGS. 7A and 7B and FIGS. 8A and 8B each include transistors 141, 142, 143, and 144, an insulating layer 164 over the transistors, and a light-emitting element over the insulating layer 164. The transistor may be in contact with the substrate, or a base insulating film may be provided between the substrate and the transistor.

The pixel portion 131 includes a plurality of light-emitting units each including a switching transistor 143, a current control transistor 144, and the first electrode 121 electrically connected to a wiring (a source electrode or a drain electrode) of the current control transistor 144.

The display devices in FIGS. 7A and 7B each include a light-emitting element 145 having a top emission structure as a display element. The display device in FIG. 8A includes a light-emitting element 146 having a bottom emission structure as a display element. FIG. 8B includes a light-emitting element 147 having a top emission structure, a bottom emission structure, or a dual emission structure, as a display element. FIG. 8B illustrates an example in which the EL layer 123 of the light-emitting element 147 is separately provided in each pixel.

In FIGS. 7A and 7B, the color filter 153 is provided over the substrate 109. Because the substrate 109 has the groove portion 107, heat is not easily conducted from the sealant 105 to the color filter 153 through the substrate 109. Thus, heat damage to the color filter 153 can be suppressed and reliability can be improved. In addition, the groove portion 107 is formed on the substrate 101 in FIG. 7B, heat is not easily conducted from the sealant 105 to the light-emitting element 145 and the like through the substrate 101. Thus, heat damage to light-emitting element 145 and the like over the substrate 101 can be suppressed and reliability can be improved. Further, heat damage to the light-emitting element 145 and the color filter 153 can be suppressed without increasing the distance between the sealant 105 and the light-emitting element 145 and the color filter 153 in FIGS. 7A and 7B; thus, the bezel can be slim.

The light-emitting element 146 or the light-emitting element 147 is provided over the substrate 101 in FIG. 8A or 8B. A color filter 171 is further provided over the substrate 101 in FIG. 8A. Because the substrate 101 has the groove portion 107, heat is not easily conducted from the sealant 105 to the light-emitting element and the color filter through the substrate 101. Thus, heat damage to the light-emitting element and the color filter can be suppressed and reliability can be improved. Further, heat damage to the light-emitting element and the color filter can be suppressed without increasing the distance between the sealant 105 and the light-emitting element and the color filter; thus, the bezel can be slim.

The terminal portion 137 is formed using a conductive layer included in a transistor or a light-emitting element in the display device. In this embodiment, the terminal portion includes a stack of a conductive layer used as gate electrodes of the transistors and a conductive layer used as source and drain electrodes of the transistors. It is preferable that the terminal portion 137 include a stack of a plurality of conductive layers, in which case strength can be increased. A connector 209 is provided in contact with the terminal portion 137. The FPC 135 is electrically connected to the terminal portion 137 through the connector 209. For the connector 209, it is possible to use a paste-form or sheet-form material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

A light-emitting element includes a pair of electrodes (the first electrode 121 and the second electrode 125); and the EL layer 123 between the pair of electrodes. One of the pair of electrodes functions as an anode and the other functions as a cathode.

In the case where the light-emitting element has a top emission structure, a conductive film that transmits visible light is used for an upper electrode, and a conductive film that reflects visible light is preferably used for a lower electrode. In the case where the light-emitting element has a bottom emission structure, a conductive film that transmits visible light is used for a lower electrode, and a conductive film that reflects visible light is preferably used for an upper electrode. In the case where the light-emitting element has a dual emission structure, a conductive film that transmits visible light is used for upper and lower electrodes.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

Note that in the case where a conductive oxide film is formed as the above conductive film having a property of transmitting visible light by a sputtering method, the use of a deposition atmosphere containing argon and oxygen allows the light-transmitting property to be increased.

Furthermore, in the case where the conductive oxide film is formed over the EL layer, it is preferable to stack a first conductive oxide film formed under an atmosphere containing argon with a reduced oxygen concentration and a second conductive oxide film formed under an atmosphere containing argon and oxygen because damage to the EL layer caused by the film formation can be reduced. Here, the purity of an argon gas used for formation of the first conductive oxide film is preferably high, and for example, it is preferable to use the argon gas whose dew point is lower than or equal to −70° C., more preferably lower than or equal to −100° C.

When a voltage higher than the threshold voltage of the light-emitting element is applied between the first electrode 121 and the second electrode 125, holes are injected from the first electrode 121 side to the EL layer 123 and electrons are injected from the second electrode 125 side to the EL layer 123. The injected electrons and holes are recombined in the EL layer 123 and a light-emitting substance contained in the EL layer 123 emits light.

The EL layer 123 includes at least a light-emitting layer. In addition to the light-emitting layer, the EL layer 123 may further include one or more layers containing any of a material with a high hole-injection property, a material with a high hole-transport property, a hole-blocking material, a material with a high electron-transport property, a material with a high electron-injection property, a bipolar property (a material with a high electron- and hole-transport property), and the like.

Either a low molecular compound or a high molecular compound can be used for the EL layer 123, and an inorganic compound may also be used. The above-described layers included in the EL layer 123 can be formed separately by any of the following methods: an evaporation method (including a vacuum evaporation method), a transfer method, a printing method, an inkjet method, a coating method, and the like.

There is no particular limitation on the structure of the transistors (e.g., the transistors 141 to 144) included in the display device. For example, a forward staggered transistor or an inverted staggered transistor may be used. Further, a top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The color filters 153 and 171 are provided in order to adjust the color of light from a pixel to increase the color purity. For example, in a full-color display device using white light-emitting elements, a plurality of pixels provided with color filters of different colors is used. In that case, the color filters may be those of three colors of R (red), G (green), and B (blue) or four colors (yellow (Y) in addition to these three colors). Further, a white (W) pixel may be added to R, G, and B pixels (and a Y pixel). That is, color filters of three colors (or four colors) may be used. Each color filter is formed in a desired position with various materials by a printing method, an inkjet method, an etching method using a photolithography technique, or the like.

A black matrix 151 is provided between the adjacent color filters 153. The black matrix 151 blocks light emitted from an adjacent pixel, thereby preventing color mixture between the adjacent pixels. In one configuration, the black matrix 151 may be provided only between adjacent pixels of different emission colors and not between pixels of the same emission color. Here, the color filter 153 is provided so that its end portions overlap with the black matrix 151, whereby light leakage can be reduced. The black matrix 151 can be formed using a material that blocks light from a pixel, for example, a metal material, a resin material including a pigment, or the like. Note that the black matrix 151 is preferably provided in a region overlapping with the driver circuit portion 133 or the like besides the pixel portion 131 as illustrated in FIG. 7A, in which case undesired leakage of guided light or the like can be prevented.

As illustrated in FIG. 7B, by providing an overcoat 152 covering the color filter 153 and the black matrix 151, an impurity such as a pigment included in the color filter 153 or the black matrix 151 can be prevented from diffusing into the light-emitting element or the like. The overcoat 152 has a light-transmitting property and can be formed using an inorganic insulating material or an organic insulating material.

The partition wall 129 is provided so as to cover an end portion of the first electrode 121. The partition wall 129 is preferably formed to have a curved surface with curvature in its upper end portion or lower end portion in order to improve the coverage with the EL layer 123 or the second electrode 125 which is formed over the partition wall 129.

As a material for the partition wall 129, a resin or an inorganic insulating material can be used. As the resin, for example, a polyimide resin, a polyamide resin, an acrylic resin, a siloxane resin, an epoxy resin, a phenol resin, or the like can be used. In particular, either a negative photosensitive resin or a positive photosensitive resin is preferably used for easy formation of the partition wall 129.

There is no particular limitation to the method for forming the partition wall; a photolithography method, a sputtering method, an evaporation method, a droplet discharging method (e.g., an inkjet method), a printing method (e.g., a screen printing method or an off-set printing method), or the like may be used.

The insulating layer 163 has an effect of preventing diffusion of impurities into a semiconductor included in the transistor. As the insulating layer 163, typically, an inorganic insulating film such as a silicon oxide film, a silicon oxynitride film, an aluminum oxide film, or an aluminum oxynitride film can be used.

As the insulating layer 164, an insulating film with a planarization function is preferably selected in order to reduce surface unevenness due to the transistor. For example, an organic material such as a polyimide resin, an acrylic resin, or a benzocyclobutene-based resin can be used. As an alternative to such an organic material, a low-dielectric constant material (a low-k material) or the like can be used. Note that the insulating layer 164 may be formed by stacking plural insulating films formed using any of these materials.

This embodiment can be combined with any other embodiment as appropriate.

Embodiment 3

In this embodiment, examples of electronic devices and lighting devices to which a sealing structure of one embodiment of the present invention is applied will be described with reference to FIGS. 9A to 9E and FIG. 10.

The electronic devices and lighting devices described in this embodiment have high reliability because an element corresponding to a sealed component (e.g., a semiconductor element, a light-emitting element, or a display element) is sealed in the sealing structure of one embodiment of the present invention.

Examples of the electronic device using an embodiment of the present invention is applied include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. Specific examples of these electronic devices and lighting devices are illustrated in FIGS. 9A to 9E and FIG. 10.

Figure 9A:
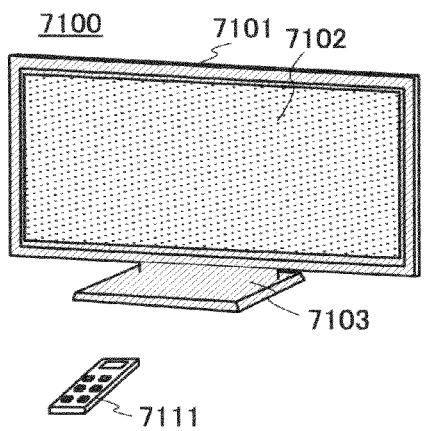
FIGS. 9A to 9E illustrate examples of an electronic device.

FIG. 9A illustrates an example of a television device. In a television device 7100, a display portion 7102 is incorporated in a housing 7101. The display portion 7102 can display images. For example, the display device of one embodiment of the present invention can be used for the display portion 7102. In addition, here, the housing 7101 is supported by a stand 7103.

The television device 7100 can be operated with an operation switch provided for the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 9B:
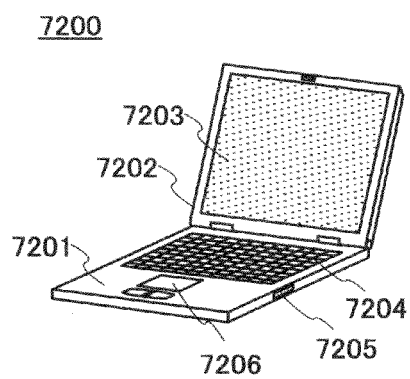

FIG. 9B illustrates an example of a computer. A computer 7200 includes a main body 7201, a housing 7202, a display portion 7203, a keyboard 7204, an external connection port 7205, a pointing device 7206, and the like. The computer is fabricated using the display device of one embodiment of the present invention for the display portion 7203.

Figure 9C:
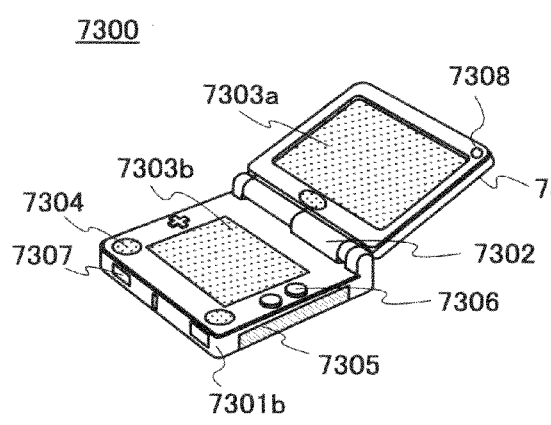

FIG. 9C illustrates an example of a portable game machine. A portable game machine 7300 has two housings, a housing 7301*a* and a housing 7301*b*, which are connected with a joint portion 7302 so that the portable game machine can be opened or closed. The housing 7301*a* incorporates a display portion 7303*a*, and the housing 7301*b* incorporates a display portion 7303*b*. In addition, the portable game machine illustrated in FIG. 9C includes a speaker portion 7304, a recording medium insertion portion 7305, an operation key 7306, a connection terminal 7307, a sensor 7308 (a sensor having a function of measuring or sensing force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), an LED lamp, a microphone, and the like. The structure of the portable game machine is not limited to the above as long as the display device according to one embodiment of the present invention is used for at least either the display portion 7303*a* or the display portion 7303*b*, or both of them. The portable game machine may be provided with other accessories as appropriate. The portable game machine illustrated in FIG. 9C has a function of reading a program or data stored in a recording medium to display it on the display portion, and a function of sharing data with another portable game machine by wireless communication. Note that a function of the portable game machine illustrated in FIG. 9C is not limited to the above, and the portable game machine can have a variety of functions.

Figure 9D:
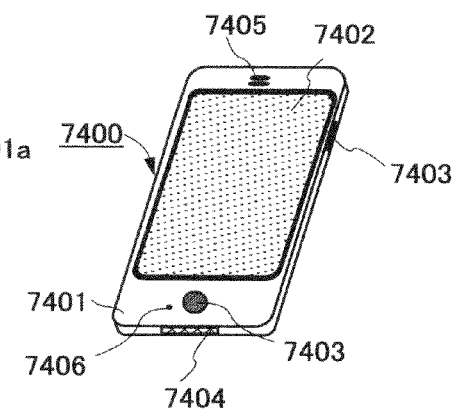

FIG. 9D illustrates an example of a mobile phone. A cellular phone 7400 is provided with a display portion 7402 incorporated in a housing 7401, an operation button 7403, an external connection port 7404, a speaker 7405, a microphone 7406, and the like. Note that the mobile phone 7400 is fabricated using the display device of one embodiment of the present invention for the display portion 7402.

When the display portion 7402 of the mobile phone 7400 illustrated in FIG. 9D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, the input mode mainly for inputting characters is selected for the display portion 7402 so that characters displayed on the screen can be input.

When a sensing device including a sensor such as a gyroscope sensor or an acceleration sensor for detecting inclination is provided inside the cellular phone 7400, display on the screen of the display portion 7402 can be automatically changed in direction by determining the orientation of the cellular phone 7400 (whether the cellular phone 7400 is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Figure 9E:
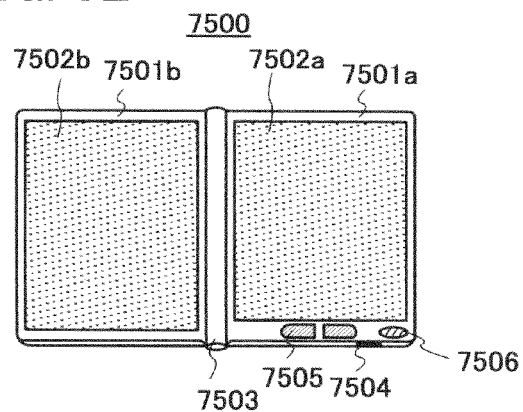

FIG. 9E illustrates an example of a foldable tablet terminal (in an open state). A tablet terminal 7500 includes a housing 7501*a*, a housing 7501*b*, a display portion 7502*a*, and a display portion 7502*b*. The housing 7501*a* and the housing 7501*b* are connected by a hinge 7503 and can be opened and closed using the hinge 7503 as an axis. The housing 7501*a* includes a power switch 7504, operation keys 7505, a speaker 7506, and the like. Note that the tablet terminal 7500 is fabricated using the display device of one embodiment of the present invention for either the display portion 7502*a* or the display portion 7502*b*, or both of them.

Part of the display portion 7502*a* or the display portion 7502*b* can be used as a touch panel region, where data can be input by touching displayed operation keys. For example, a keyboard can be displayed on the entire region of the display portion 7502*a* so that the display portion 7502*a* is used as a touch screen, and the display portion 7502*b* can be used as a display screen.

Figure 10:
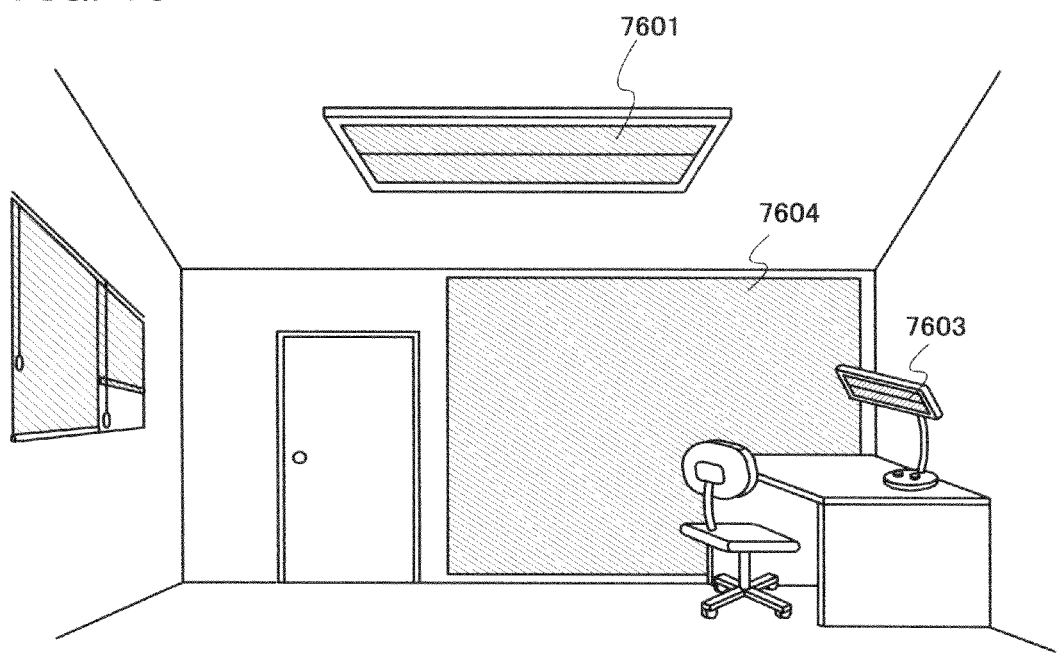
FIG. 10 illustrates an example of a lighting device.

An indoor lighting device 7601, a roll-type lighting device 7602, a desk lamp 7603, and a planar lighting device 7604 illustrated in FIG. 10 are each an example of a lighting device which includes the light-emitting device of one embodiment of the present invention. Since the light-emitting device of one embodiment of the present invention can have a larger area, it can be used as a lighting device having a large area. Further, since the light-emitting device is thin, it can be mounted on a wall.

This embodiment can be combined with any other embodiment as appropriate.

EXAMPLE 1

In this example, temperature distribution of a sealing structure when a sealant is heated was estimated by calculation. ANSYS Mechanical was used for the calculation in this example.

<Models and Conditions of Calculation>

In this example, model 1 to which one embodiment of the present invention is applied and model 2 which is a comparative example were used for calculation. The structures of model 1 and model 2 are shown in FIGS. 11A and 11B, respectively.

Figure 11A:
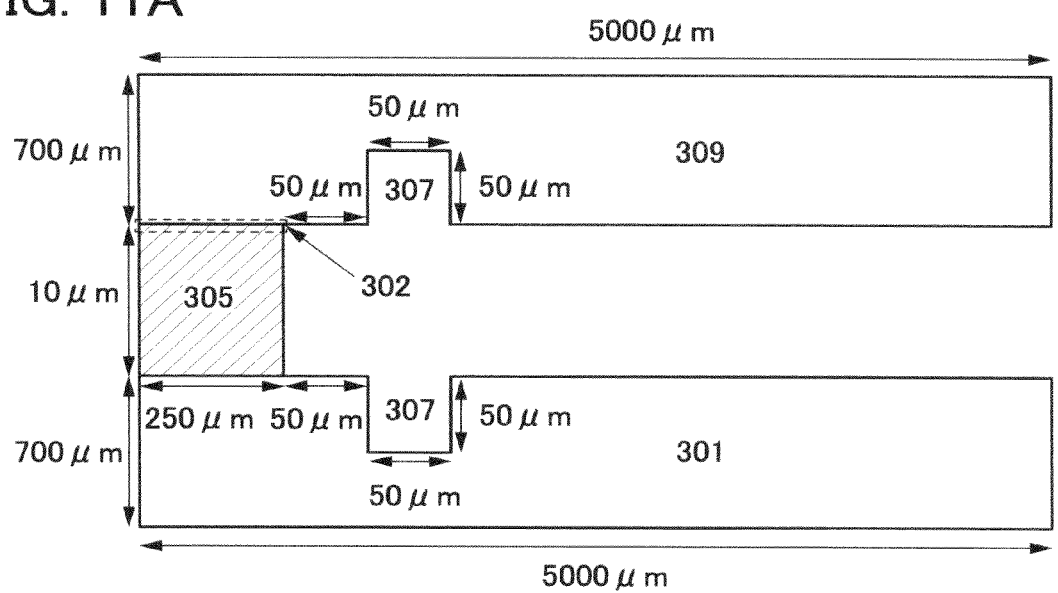
FIGS. 11A and 11B are diagrams each illustrating a model used for calculation in Example.

As shown in FIG. 11A, model 1 to which one embodiment of the present invention is applied has a groove portion 307 in each first surface of a glass substrate 301 and a glass substrate 309. The distance between a sealant 305 and the groove portion 307 was 50 μm. The width and the depth of the groove portion 307 was each 50 μm.

Figure 11B:
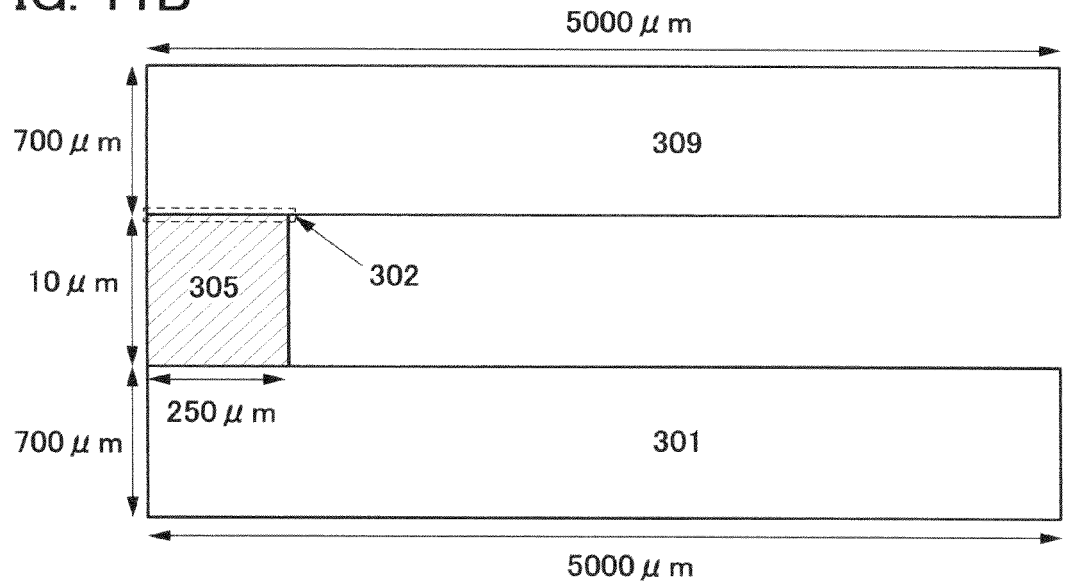

As shown in FIG. 11B, model 2 which is a comparative example has no groove portion on either glass substrates 301 or 309.

In model 1 and model 2, the width and the thickness of the glass substrates 301 and 309 were 5000 μm and 700 μm, respectively; the width and the thickness of the sealant 305 were 250 μm and 10 μm, respectively.

Figure 17A:
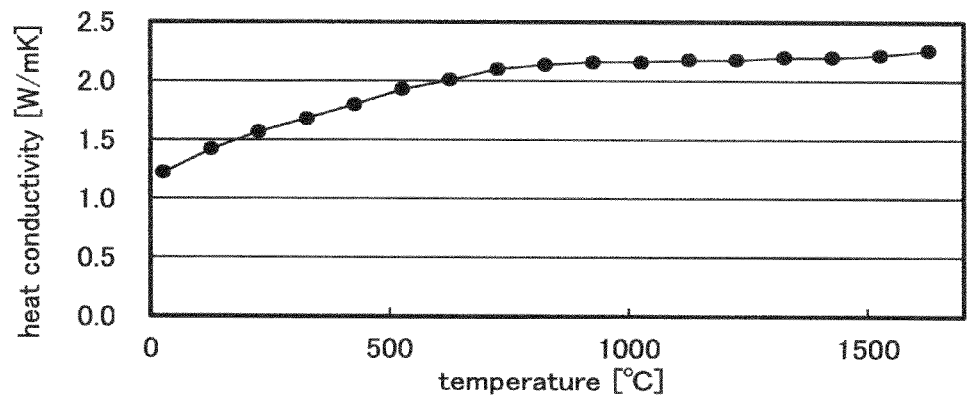
FIGS. 17A to 17C are graphs showing calculation conditions in Example.

The heat conductivity of the glass substrates 301 and 309 was calculated every 100° C. in a range from 27° C. to 1627° C. and plotted at 1.22 (W/mK), 1.42, 1.57, 1.68, 1.80, 1.93, 2.01, 2.10, 2.14, 2.16, 2.16, 2.18, 2.18, 2.20, 2.20, 2.22, 2.26 (see FIG. 17A).

Figure 17B:
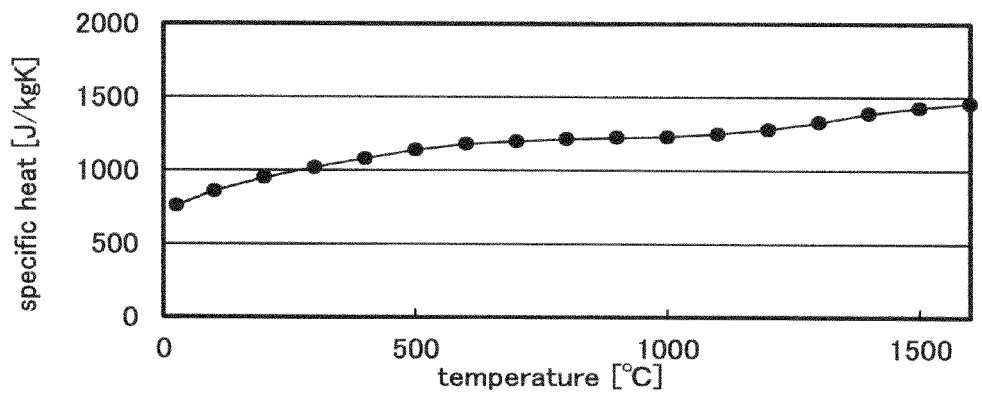

The specific heat of the glass substrates 301 and 309 was 760 J/kgK at 25° C., calculated every 100° C. in a range 100° C. to 1600° C. and plotted at 860 (J/kgK), 950, 1020, 1080, 1140, 1180, 1200, 1215, 1225, 1230, 1250, 1280, 1330, 1390, 1430, 1460 (see FIG. 17B).

The densities of the glass substrates 301 and 309 were each $2.40 \times 10^3$ kg/m$^3$ regardless of temperature.

Figure 17C:
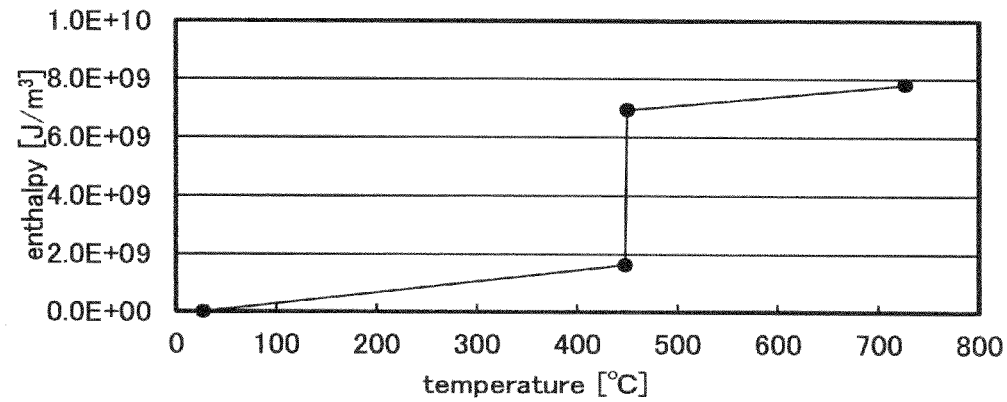

The sealant 305 was assumed to be formed using a glass frit containing boric oxide. The heat conductivity of the sealant 305 was 1 W/mK regardless of temperature. The sealant 305 was in a crystal phase at 27° C. and was changed in an amorphous phase by phase transition. The enthalpy of the sealant 305 at 27° C., 448° C., 450° C., 727° C. was 0 (J/m$^3$), $1.63 \times 10^9$, $6.92 \times 10^9$, $7.80 \times 10^9$, respectively (see FIG. 17C).

In this example, temperature distribution of each model when laser light irradiation to the sealant 305 on the glass substrate 309 side was performed was estimated by calculation. Note that a surface of the sealant 305 that is in contact with the glass substrate 309 was heated (see a heated region 302).

In the calculation, the initial temperature was 27° C., the heating time was 0.030 (the start time of heating was 0 s, the end time of heating was 0.030 s), and the heat flux was $1.03 \times 10^7$ W/m$^2$. Note that this value of heat flux was obtained by calculating a value when the whole sealant 305 of model 2 (comparative example) exceeds 450° C. under the condition that the heating time was 0.030 s.

<Calculation Results>

Figure 12A:
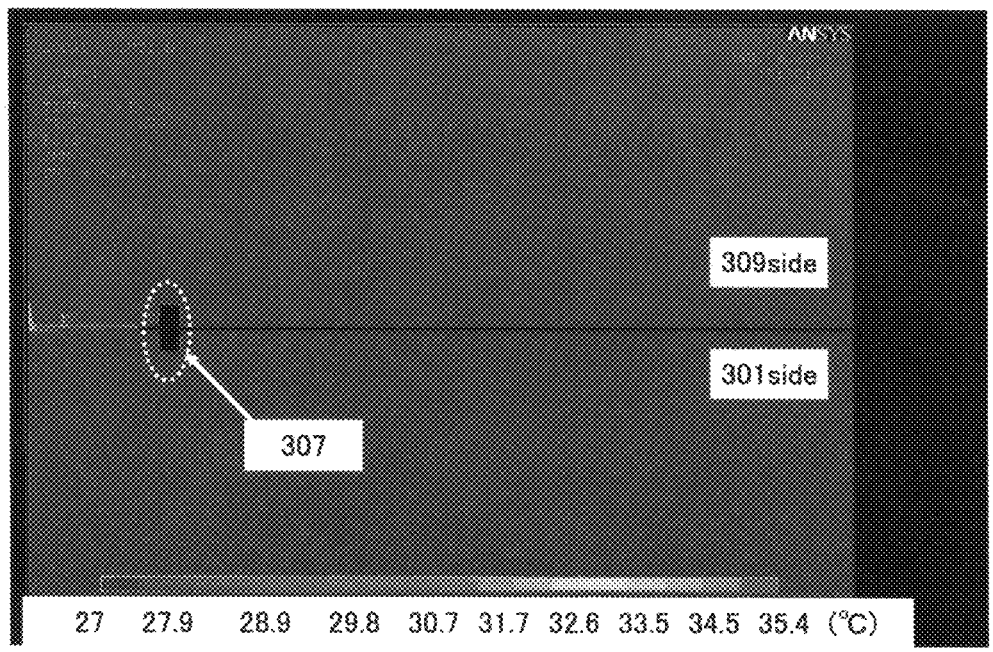
FIGS. 12A and 12B are graphs showing calculation results in Example.
Figure 12B:
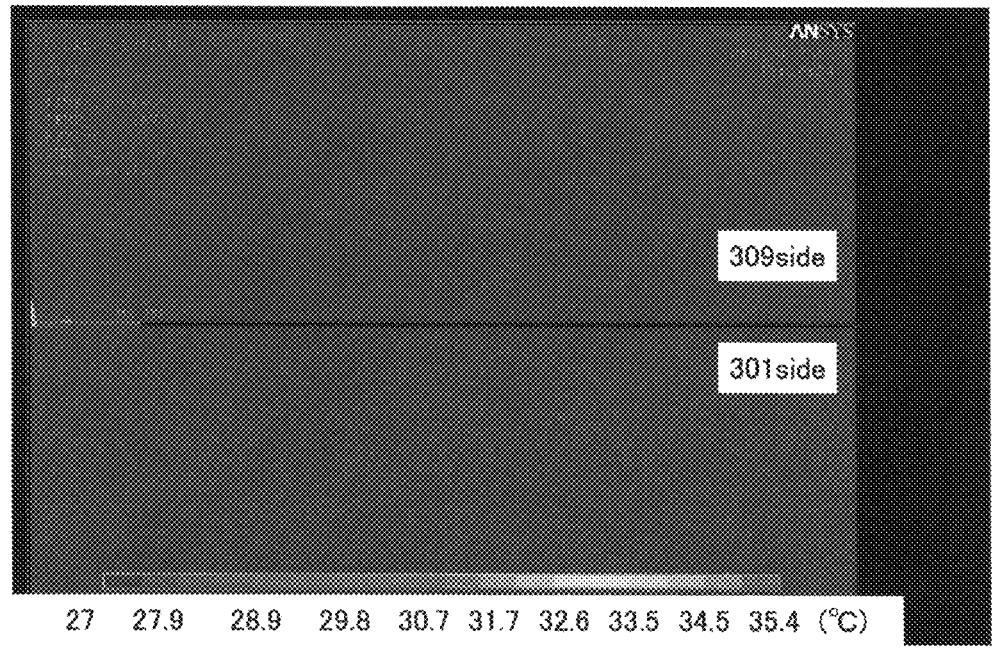
Figure 13A:
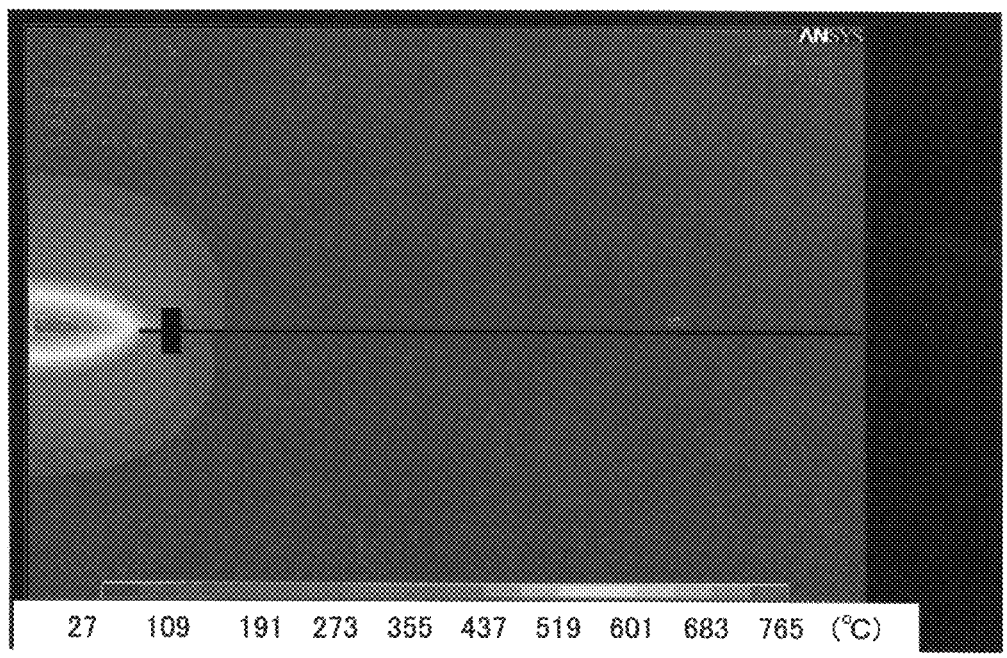
FIGS. 13A and 13B are graphs showing calculation results in Example.
Figure 13B:
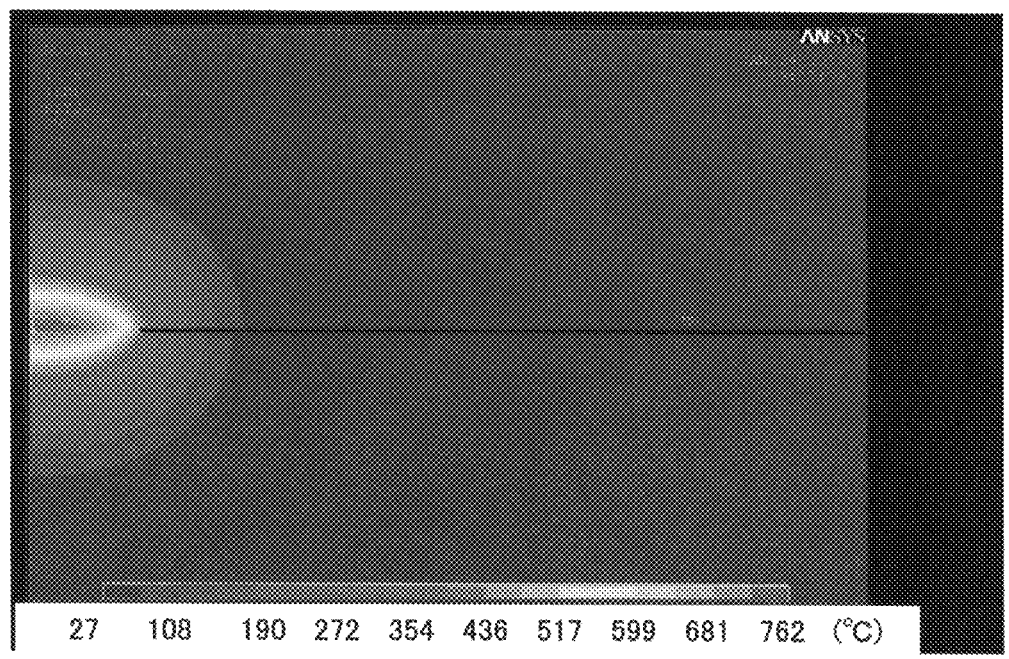
Figure 14A:
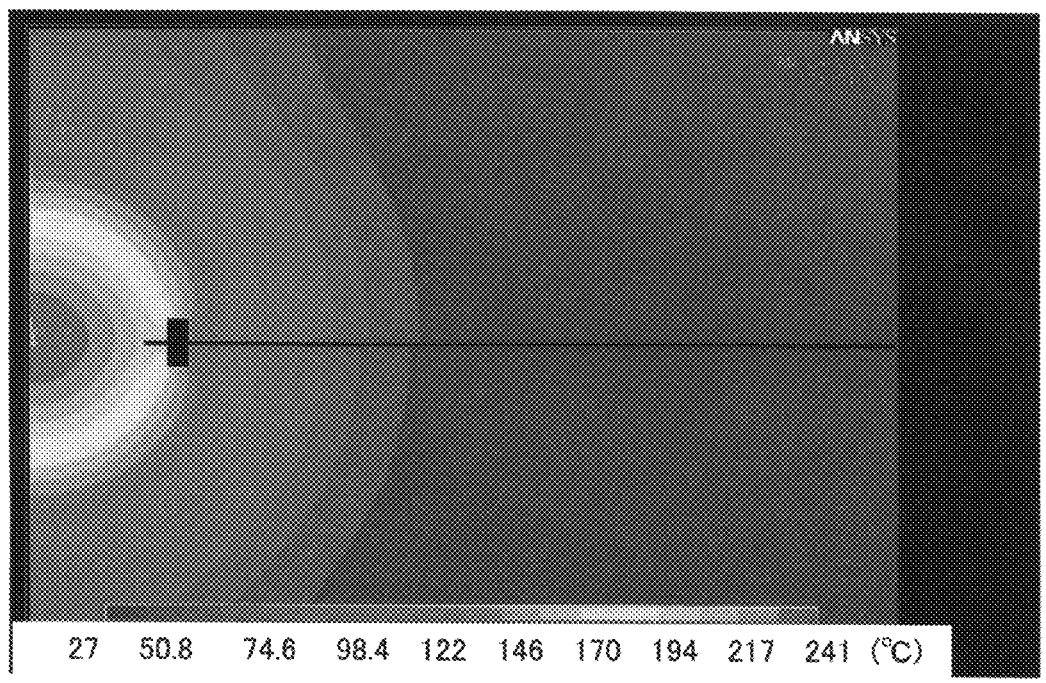
FIGS. 14A and 14B are graphs showing calculation results in Example.
Figure 14B:
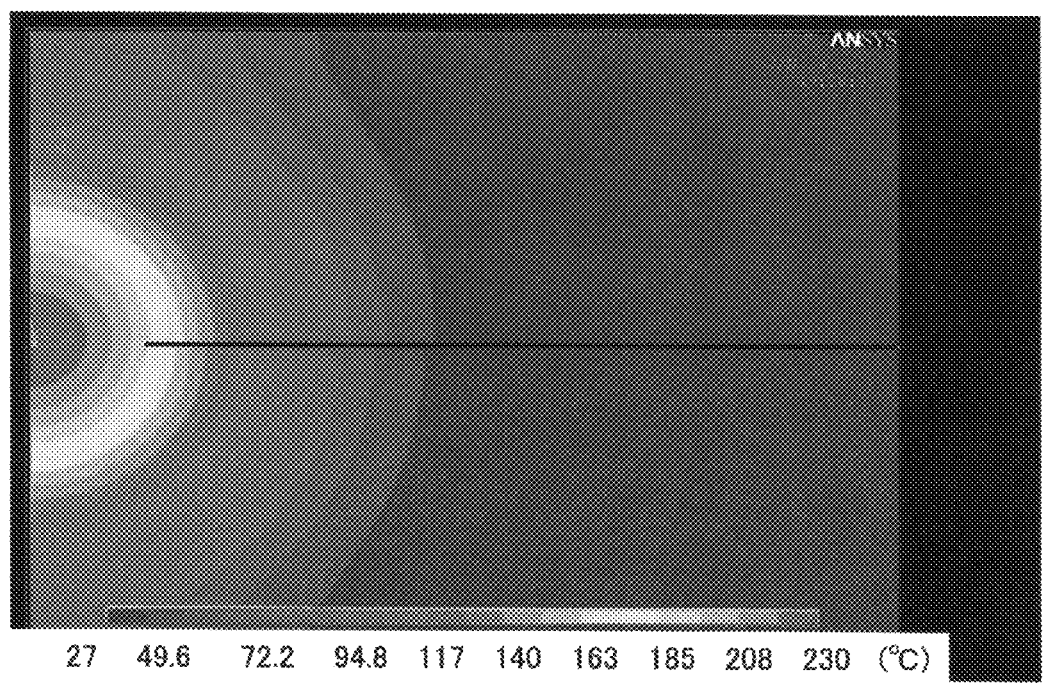

FIGS. 12A, 13A and 14A show calculation results of temperature distribution of model 1. FIGS. 12B, 13B and 14B show calculation results of temperature distribution of model 2. FIGS. 12A and 12B are results just after the start of heating. FIGS. 13A and 13B are results at the time of 0.031 s. FIGS. 14A and 14B are results at the time of 0.100 s.

According to the results, in both model 1 and model 2, the temperature on the glass substrate 309 side is likely to be high, that is closer to the heated region, and heat is likely to be conducted in a wider range. In addition, the range of heat conduction is smaller in model 1 than in model 2.

Figure 15A:
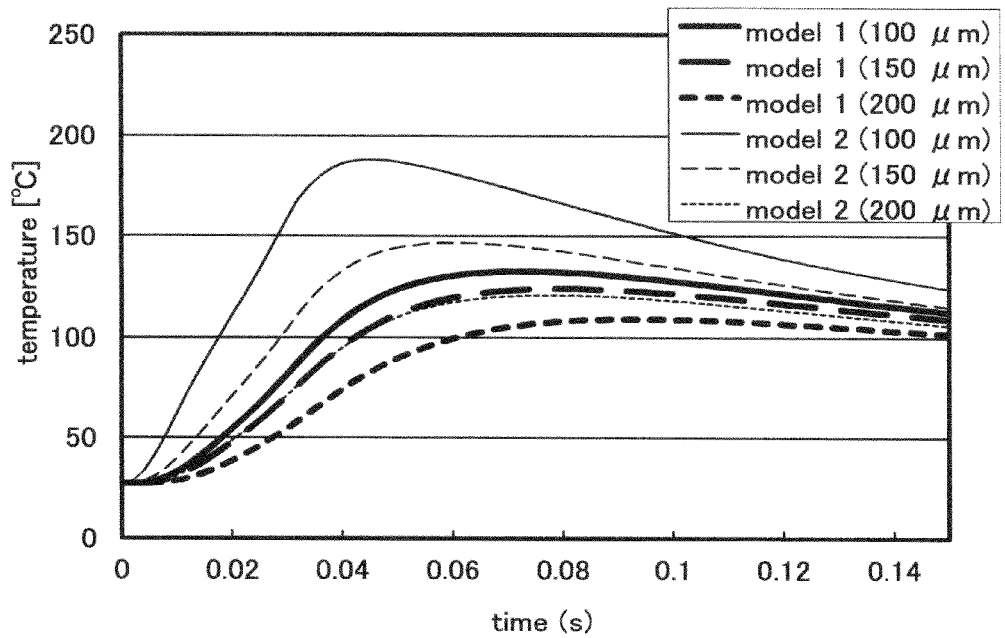
FIGS. 15A and 15B are graphs showing calculation results in Example.
Figure 15B:
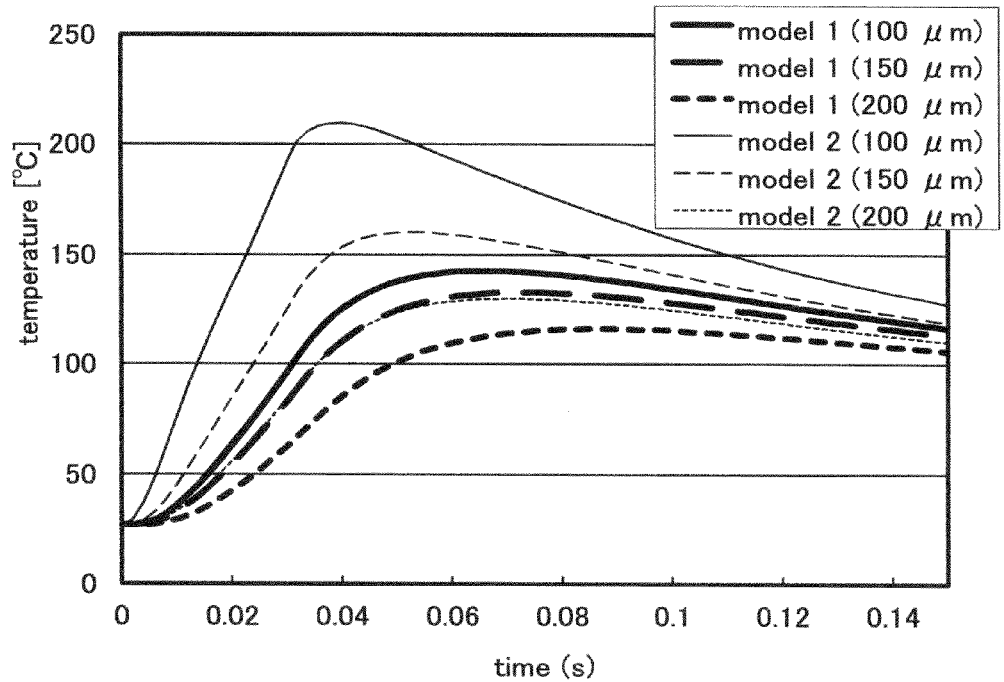

FIGS. 15A and 15B show change in temperature at positions of 100 μm, 150 μm, and 200 μm apart from the sealant 305 on the first surfaces of the substrates according to the calculation results. FIGS. 15A and 15B are results for the substrate 101 and the substrate 109, respectively. In FIGS. 15A and 15B, the vertical axis and the horizontal axis indicate temperature and time, respectively.

In FIGS. 15A and 15B, change in temperature in model 1 is smaller than in model 2 when compared between model 1 and model 2 at the same distance from the sealant 305. In particular, as a portion is closer to sealant 305, the change in temperature is much smaller in model 1 than in model 2.

Figure 16A:
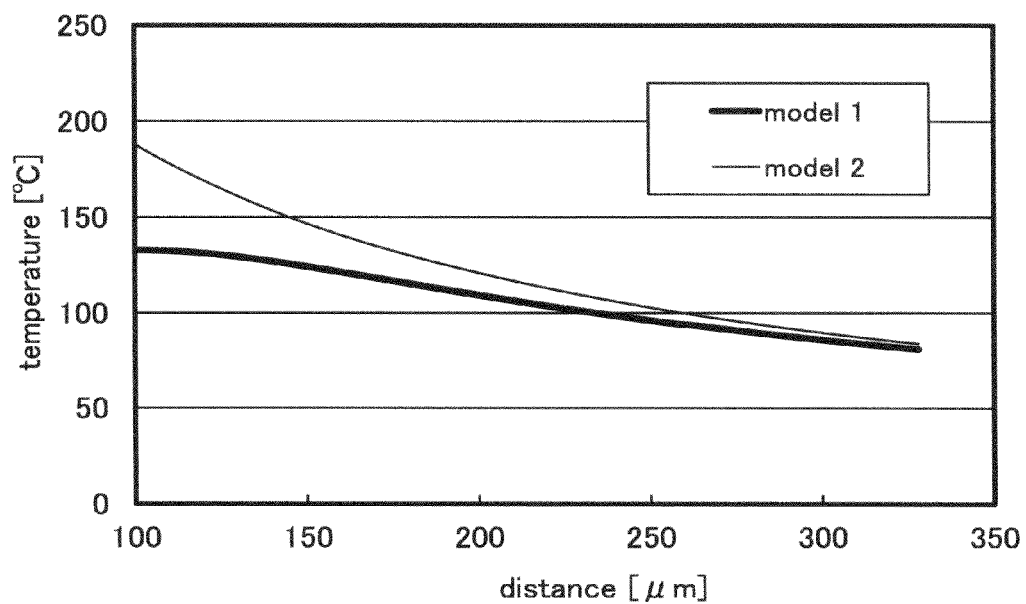
FIGS. 16A and 16B are graphs showing calculation results in Example.
Figure 16B:
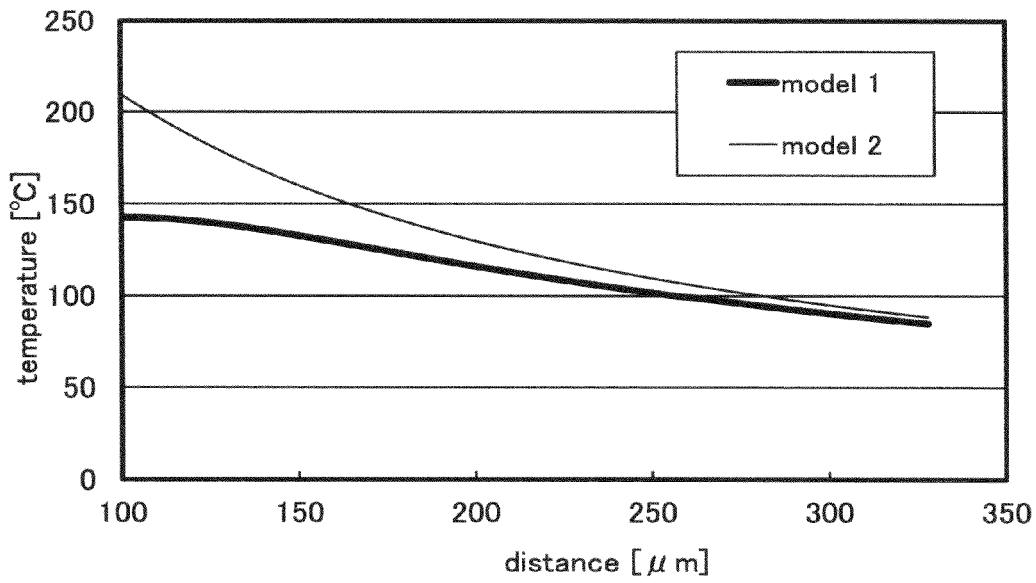

FIGS. 16A and 16B each show the highest temperature at each point on the first surface of the substrate according to the calculation results. FIGS. 16A and 16B are results for the substrate 101 and the substrate 109, respectively. In FIGS. 16A and 16B, the vertical axis and the horizontal axis indicate temperature and the distance from the sealant 105, respectively.

In FIGS. 16A and 16B, the highest temperature in model 1 is lower than in model 2 when compared between model 1 and model 2 at the same distance from the sealant 305. In particular, as a portion is closer to sealant 305, the highest temperature is much lower in model 1 than in model 2.

According to the calculation results in this example, it was suggested that if a sealant was heated locally, heat was conducted from the sealant through a groove portion and heat damage to a sealed component was thus suppressed. In particular, an increase in temperature is suppressed on a glass substrate close to the sealant, so that the sealed component can be provided at a portion on the glass substrate close to the sealant and the groove portion. Thus, the sealing structure whose border is slim is obtained.

This application is based on Japanese Patent Application serial no. 2013-045722 filed with Japan Patent Office on Mar. 7, 2013, the entire contents of which are hereby incorporated by reference.

What is claimed is:

1. A device comprising:
a first substrate comprising a groove portion;
an object over the first substrate;
a second substrate over the object; and
a sealant between the first substrate and the second substrate and surrounding the object and the groove portion,
wherein the groove portion is located between the object and the sealant, and
wherein at least part of a surface of the groove portion is exposed.

2. The device according to claim 1, further comprising:
a first electrode over the first substrate;
a partition wall over the first electrode and;
a second electrode over the object,
wherein the object is located over the first electrode and the partition wall,
wherein the second substrate is located over the second electrode,
wherein the first electrode and the sealant overlap each other, and
wherein the object comprises an electroluminescent layer.

3. The device according to claim 2, further comprising a conductive layer over the first substrate,
wherein the partition wall is located over the conductive layer,
wherein the conductive layer is in contact with the second electrode, and
wherein the conductive layer and the sealant overlap each other.

4. The device according to claim 1, wherein the object comprises a color filter.

5. The device according to claim 1, wherein the groove portion comprises a plurality of grooves.

6. The device according to claim 1, wherein the sealant comprises a glass material.

7. The device according to claim 1, wherein each of the first substrate and the second substrate is a glass substrate.

8. A device comprising:
a first substrate comprising a first groove portion;
a transistor over the first substrate;
a first insulating film over the transistor;
a first electrode over the first insulating film;
a partition wall over the first electrode;
an electroluminescent layer over the first electrode and the partition wall;
a second electrode over the electroluminescent layer;
a second substrate over the second electrode;
a sealant between the first substrate and the second substrate and surrounding the electroluminescent layer and the first groove portion;
a conductive film between the first substrate and the sealant; and
a flexible printed circuit electrically connected to the conductive film,
wherein the first groove portion is located between the electroluminescent layer and the sealant.

9. The device according to claim 8, wherein the flexible printed circuit is located outside a sealed region sealed by the first substrate, the second substrate, and the sealant.

10. The device according to claim 8, wherein the sealant is in contact with the first insulating film.

11. The device according to claim 8, further comprising a second insulating film between the first substrate and the transistor and in the first groove portion.

12. The device according to claim 8, further comprising a color filter between the first insulating film and the first electrode, wherein the color filter and the electroluminescent layer overlap each other.

13. The device according to claim 8, further comprising a color filter between the second substrate and the second electrode, wherein the second substrate comprises a second groove portion between the sealant and the color filter.

14. The device according to claim 13, wherein the first groove portion and the second groove portion are different from each other in the number of grooves included therein.

15. The device according to claim 8, wherein the first groove portion comprises a plurality of grooves.

16. The device according to claim 8, wherein the sealant comprises a glass material.

17. The device according to claim 8, wherein each of the first substrate and the second substrate is a glass substrate.

18. A method for manufacturing a device, the method comprising the steps of:
forming a groove portion on a surface of a first substrate;
forming an object over the surface of the first substrate;
forming a precursor of a sealant over a second substrate;
after forming the groove portion, the object, and the precursor of the sealant, attaching the first substrate and the second substrate to each other so that the precursor of the sealant is located between the first substrate and the second substrate; and
forming the sealant by heating the precursor of the sealant,
wherein the sealant surrounds the object and the groove portion,
wherein the groove portion is located between the object and the sealant, and
wherein at least part of a surface of the groove portion is exposed.

19. The method according to claim 18, wherein the precursor of the sealant comprises a glass frit or a glass ribbon.

20. The method according to claim 18, wherein the precursor of the sealant is locally heated by laser light irradiation.

21. The method according to claim 18, wherein the object comprises an electroluminescent layer.

22. The method according to claim 18, wherein each of the first substrate and the second substrate is a glass substrate.

* * * * *